(12) United States Patent
Lee

(10) Patent No.: US 8,742,389 B2
(45) Date of Patent: Jun. 3, 2014

(54) VARIABLE RESISTANCE MEMORY DEVICE AND METHOD OF FORMING THE SAME

(71) Applicant: Seok-won Lee, Seongnam-si (KR)

(72) Inventor: Seok-won Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/655,634

(22) Filed: Oct. 19, 2012

(65) Prior Publication Data
US 2013/0193395 A1    Aug. 1, 2013

(30) Foreign Application Priority Data

Jan. 27, 2012 (KR) .................. 10-2012-0008375

(51) Int. Cl.
*H01L 29/02* (2006.01)

(52) U.S. Cl.
USPC ..... 257/4; 257/2; 257/3; 257/5; 257/E29.002; 438/102; 438/103; 438/104; 365/163

(58) Field of Classification Search
CPC ....... H01L 43/08; H01L 27/22; H01L 43/065; G11C 11/16
USPC .................. 257/1–5, E29.002; 438/102–104; 365/163
See application file for complete search history.

(56) References Cited

U.S. PATENT DOCUMENTS

| | | | |
|---|---|---|---|
| 7,812,335 | B2 | 10/2010 | Scheuerlein |
| 8,084,805 | B2 | 12/2011 | Shim et al. |
| 2009/0256129 | A1 | 10/2009 | Scheuerlein |
| 2010/0078701 | A1 | 4/2010 | Shim et al. |
| 2011/0068312 | A1 | 3/2011 | Sekine et al. |
| 2012/0225533 | A1* | 9/2012 | Kim .............................. 438/382 |

FOREIGN PATENT DOCUMENTS

| | | |
|---|---|---|
| KR | 20110031091 A | 3/2011 |
| KR | 20110073648 A | 6/2011 |
| KR | 20110114038 A | 10/2011 |

* cited by examiner

*Primary Examiner* — Jami M Valentine
(74) *Attorney, Agent, or Firm* — Harness, Dickey & Pierce, P.L.C.

(57) ABSTRACT

According to example embodiments, a variable resistance memory device may include memory cells, in which contact areas between word lines and a variable resistance layer are almost constant. The variable resistance memory device may include a vertical electrode on a substrate, horizontal electrode layers and insulating layers sequentially and alternately stacked on the substrate. The horizontal electrode layers and the insulating layers may be adjacent to the vertical electrode. The variable resistance layer may be between the vertical electrode the horizontal electrode layers. A thickness of one of the horizontal electrode layers adjacent to the substrate may be thickness than a thickness of an other of the horizontal electrode layers that is spaced apart from the substrate.

16 Claims, 25 Drawing Sheets

VARIABLE RESISTANCE MEMORY DEVICE AND METHOD OF FORMING THE SAME

CROSS-REFERENCE TO RELATED APPLICATIONS

This U.S. non-provisional patent application claims priority under 35 U.S.C. §119 to Korean Patent Application No. 10-2012-0008375, filed on Jan. 27, 2012, in the Korean Intellectual Property Office, the entire contents of which are hereby incorporated by reference.

BACKGROUND

Example embodiments of inventive concepts relate to variable resistance memory devices and/or methods of forming the same.

Next-generation semiconductor memory devices (e.g., a ferroelectric random access memory (FRAM), a magnetic random access memory (MRAM), a phase-change random access memory (PRAM), and so forth) are being developed to satisfy increasing demands for high performance and low power consumption of semiconductor memory devices. In the next-generation semiconductor memory devices, memory elements may be formed of non-volatile and variable resistance materials. In other words, the memory element may exhibit an electric resistance that can be selectively changed depending on a current or voltage applied thereto and that may be preserved even when a current or voltage is not supplied.

As semiconductor devices become highly integrated, variable resistance memory devices may become more integrated.

SUMMARY

Example embodiments of inventive concepts relate to integrated variable resistance memory devices.

Example embodiments of inventive concepts also relate to methods of fabricating the highly integrated variable resistance memory devices.

According to example embodiments of inventive concepts, a variable resistance memory device includes: a vertical electrode on a substrate, horizontal electrode layers and insulating layers sequentially and alternately stacked on the substrate, the horizontal electrode layers and the insulating layers being adjacent to the vertical electrode; and a variable resistance layer between the vertical electrode and the horizontal electrode layers. A thickness of one of the horizontal electrode layers adjacent to the substrate may be thicker than a thickness of an other of the horizontal electrode layers that is spaced apart from the substrate.

In example embodiments, the horizontal electrode layers and the insulating layers may define a vertical electrode hole. A width of an upper portion of the vertical electrode hole may be greater than a width of a lower portion of the vertical electrode hole. In example embodiments, the vertical electrode and the variable resistance layer may be in the vertical electrode hole.

In example embodiments, a contact area between the one of the horizontal electrode layers that is adjacent to the substrate and the variable resistance layer may be substantially equivalent to a contact area between the other of horizontal electrode layers that is spaced apart from the substrate and the variable resistance layer.

In example embodiments, the horizontal electrode layers may include a first horizontal electrode layer and a second horizontal electrode layer that may be positioned at lowermost and uppermost levels of the horizontal electrode layers respectively. A thickness of the first horizontal electrode layer may be greater than a thickness of the second horizontal electrode layer.

In example embodiments, the horizontal electrode layers may further include a third horizontal electrode layer between the first horizontal electrode layer and the second horizontal electrode layer. The third horizontal electrode layer may be thinner than the first horizontal electrode layer and thicker than the second horizontal electrode layer.

In example embodiments, a selection line may be below the first horizontal electrode layer. A thickness of the selection line may be less than the thickness of the first horizontal electrode layer and greater than the thickness of the second horizontal electrode layer.

In example embodiments, the number of the horizontal electrode layers may be at least four. At least two lower ones of the horizontal electrode layers may have the substantially equal thicknesses, and at least two upper ones of the horizontal electrode layers may have the substantially equal thicknesses. The thicknesses of the at least two lower ones of the horizontal electrode layers may be greater than the thicknesses of the at least two upper ones of the horizontal electrode layers.

In example embodiments, the variable resistance memory device may include at least two sections stacked on the substrate, at least two vertical electrodes stacked on the substrate, and at least two variable resistance layers stacked on the substrate. Each of the at least two sections may include one of the at least two vertical electrodes, at least one of the horizontal electrode layers, at least one of the insulating layers, and one of the at least two the variable resistance layers.

In example embodiments, the horizontal electrode layers may include a plurality of odd-numbered word lines and a plurality of even-numbered word lines, which are alternately disposed parallel to each other. The odd-numbered word lines may be electrically connected to each other. The even-numbered word lines may be electrically connected to each other. The odd-numbered word lines may be electrically isolated from the even-numbered word lines.

In example embodiments, a selection gate electrode may be between the substrate and a lowermost one of the horizontal electrodes layers. A selection gate insulating layer may be between the selection gate electrode and the substrate. The substrate may include first and second doped regions under both sides of the selection gate electrode.

In example embodiments, a bit line may cross over an uppermost one of the horizontal electrode layers. The bit line may be electrically isolated from the horizontal electrode layers. A bit line contact may electrically connect the bit line to the second doped region.

In example embodiments, the vertical electrode may be connected to the first doped region of the substrate.

According to example embodiments of inventive concepts, a method of fabricating a variable resistance memory device may include: alternatingly stacking a plurality of sacrificial layers and insulating layers on a substrate; patterning the plurality of sacrificial layers and insulating layers to form a vertical electrode hole defined by the plurality of sacrificial layers and insulating layers; forming a variable resistance layer and a vertical electrode in the vertical electrode hole; and replacing the sacrificial layer with a horizontal electrode layer. A thickness of the plurality of sacrificial layers with a plurality of horizontal electrode layers. The plurality of sacrificial layers may include a lowermost sacrificial layer and an uppermost sacrificial layer. The lowermost sacrificial layer may have a thickness that is greater than a thickness of the uppermost sacrificial layer.

According to example embodiments of inventive concepts, a variable memory device includes: a substrate; a vertical electrode on the substrate; a variable resistance layer surrounding the vertical electrode; and 1 to N horizontal electrodes sequentially stacked on each other and spaced part vertically along a sidewall of the variable resistance layer. N may be an integer greater than or equal to 2. A thickness of the 1st horizontal electrode may be greater than a thickness of the Nth horizontal electrode.

In example embodiments, the device may further include a plurality of bit lines, a plurality of bit line contacts connecting the plurality of bit lines to the substrate, and a plurality of odd word lines and a plurality of even word lines spaced apart vertically on the substrate. The vertical electrode may be one of a plurality of vertical electrodes on the substrate. The 1 to N horizontal electrodes may be part of 1 to N horizontal electrode layers spaced apart vertically on the substrate. The 1 to N horizontal electrode layers may define a plurality of first openings that are penetrated by the plurality of bit line contacts. The 1 to N horizontal electrode layers may define a plurality of second openings that are penetrated by the plurality of vertical electrodes. Each one of the plurality of odd word lines may be connected to at least one horizontal electrode in one of the 1 to N horizontal electrode layers. Each one of the plurality of even word lines may be connected to at least one horizontal electrode in one of the 1 to N horizontal electrode layers. The plurality of odd word lines may be electrically isolated from the plurality of even word lines.

In example embodiments, a selection gate electrode may be between the 1st horizontal electrode and the substrate. N may be greater than or equal to 3. The 2nd to Nth horizontal electrodes may be thinner than the 1st horizontal electrode.

In example embodiments, a selection gate electrode may be between the 1st horizontal electrode and the substrate. N may be greater than or equal to 4. A thickness of the (N-1)th horizontal electrode of the horizontal electrodes may be substantially equal to the thickness of the 1st horizontal electrode of the horizontal electrodes. A thickness of the 2nd horizontal electrode may be substantially equal to the thickness of the 1st horizontal electrode In example embodiments, a selection gate electrode may be between the 1st horizontal electrode and the substrate. N may be greater than or equal to 4. A thickness of the (N-1)th horizontal electrode of the horizontal electrodes may be different than the thickness of the 1st horizontal electrode of the horizontal electrodes.

BRIEF DESCRIPTION OF THE DRAWINGS

The foregoing and other features of inventive concepts will be more clearly understood from the following brief description taken in conjunction with the accompanying drawings. The accompanying drawings represent non-limiting, example embodiments as described herein.

Figure 1:
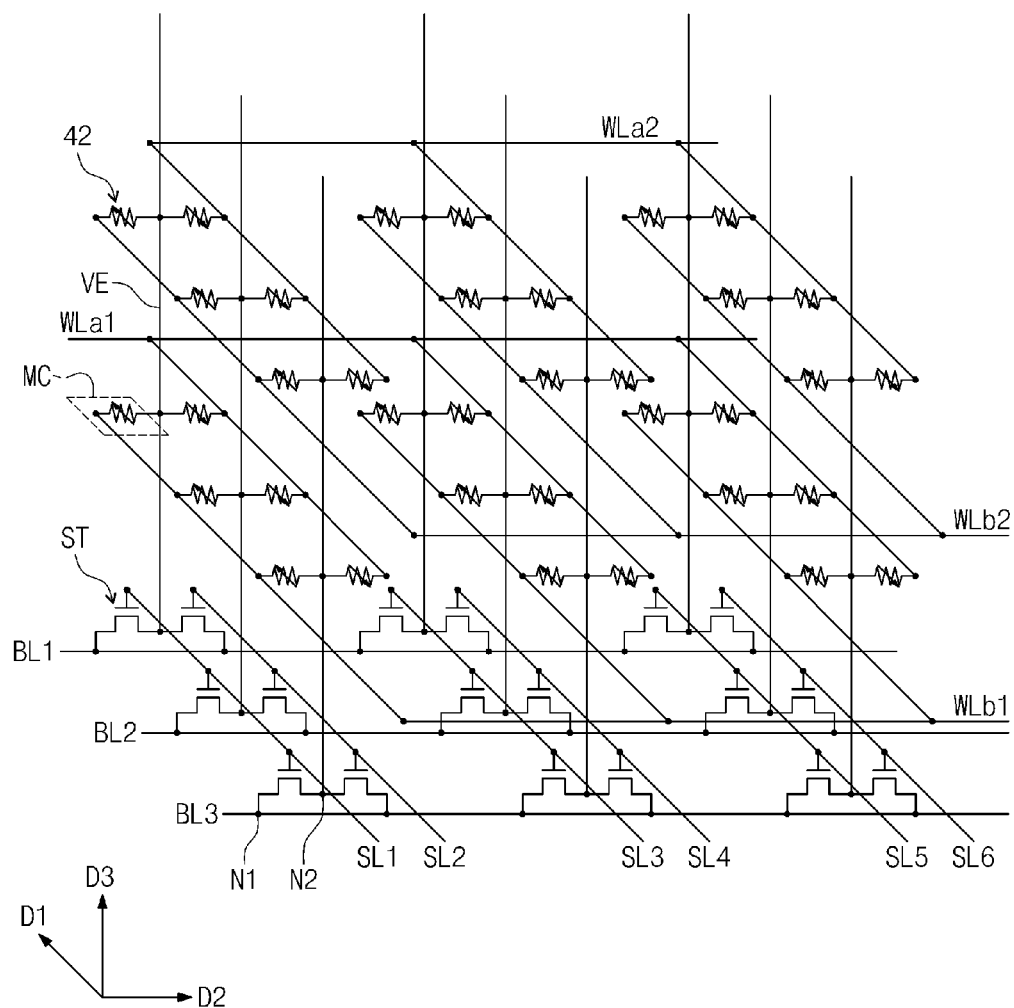
FIG. 1 is a circuit diagram of a variable resistance memory device according to example embodiments of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which some example embodiments of inventive concepts are shown. Example embodiments of inventive concepts may, however, be embodied in many different forms and should not be construed as being limited to the embodiments set forth herein; rather, these embodiments are provided so that this disclosure will be thorough and complete, and will fully convey the scope of inventive concepts to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a circuit diagram illustrating a variable resistance memory device according to example embodiments of inventive concepts.

Referring to FIG. 1, a variable resistance memory device according to example embodiments of inventive concepts may include a plurality of memory cells MC arranged in a matrix form. The memory cells MC may include variable resistance devices 42, respectively. The variable resistance device 42 may be connected to a selection transistor ST with word lines WLa1, WLb1, WLa2, and WLb2. The word lines WLa1, WLb1, WLa2, and WLb2 may extend along a first direction D1. The variable resistance device 42 may include, for example, phase-change materials, transition metal oxides, ferroelectric materials, or magnetic materials. According to a material of the variable resistance device 42, the variable resistance memory device may be used to realize a phase-change random access memory (PRAM), a resistance RAM (RRAM), a ferroelectric RAM (FRAM) or a magnetic RAM (MRAM). The variable resistance device 42 may have an electric resistance that may be selectively changed depending on an amount of electric current supplied through the selection transistor ST.

The selection transistor ST may be disposed between the variable resistance device 42 and bit lines BL1, BL2, and BL3 to connect them with each other. The bit lines BL1, BL2, and BL3 may extend along a second direction D2. The selection transistor ST may include gate electrodes connected to selection lines SL1-SL6. The selection transistor ST may include a second node N2 connected to a vertical electrode VE and a first node N1 connected to the corresponding one of the bit lines BL1, BL2, and BL3. The vertical electrode VE may extend along a third direction D3. The first, second, and third directions D1, D2, and D3 may cross each other. Each of the vertical electrodes VE may be connected to a plurality of the variable resistance devices 42 provided at different levels from each other. A pair of the selection transistors ST adjacent to each other may share one of the bit lines BL and one of the vertical electrodes VE.

The word lines WLa1, WLb1, WLa2, and WLb2 may be disposed at several levels to be parallel to each other. Odd-numbered ones WLa1 of the word lines WLa1 and WLb1 disposed at a first level may be connected to each other. Even-numbered ones WLb1 of the word lines WLa1 and WLb1 disposed at the first level may be connected to each other but be electrically isolated from the odd-numbered word lines WLa1. Odd-numbered ones WLa2 of the word lines WLa2 and WLb2 disposed at a second level may be connected to each other. Even-numbered ones WLb2 of the word lines WLa2 and WLb2 disposed at the second level may be connected to each other but be electrically isolated from the odd-numbered word lines WLa2.

While FIG. 1 illustrates a circuit diagram including three bit lines BL1 to BL3, two odd word lines WLa1 and WLa2, and two even word lines WLb1 and WLb2, example embodiments of inventive concepts are not limited thereto and may include more than three bit lines and/or more than two even and/or odd word lines.

Figure 2A:
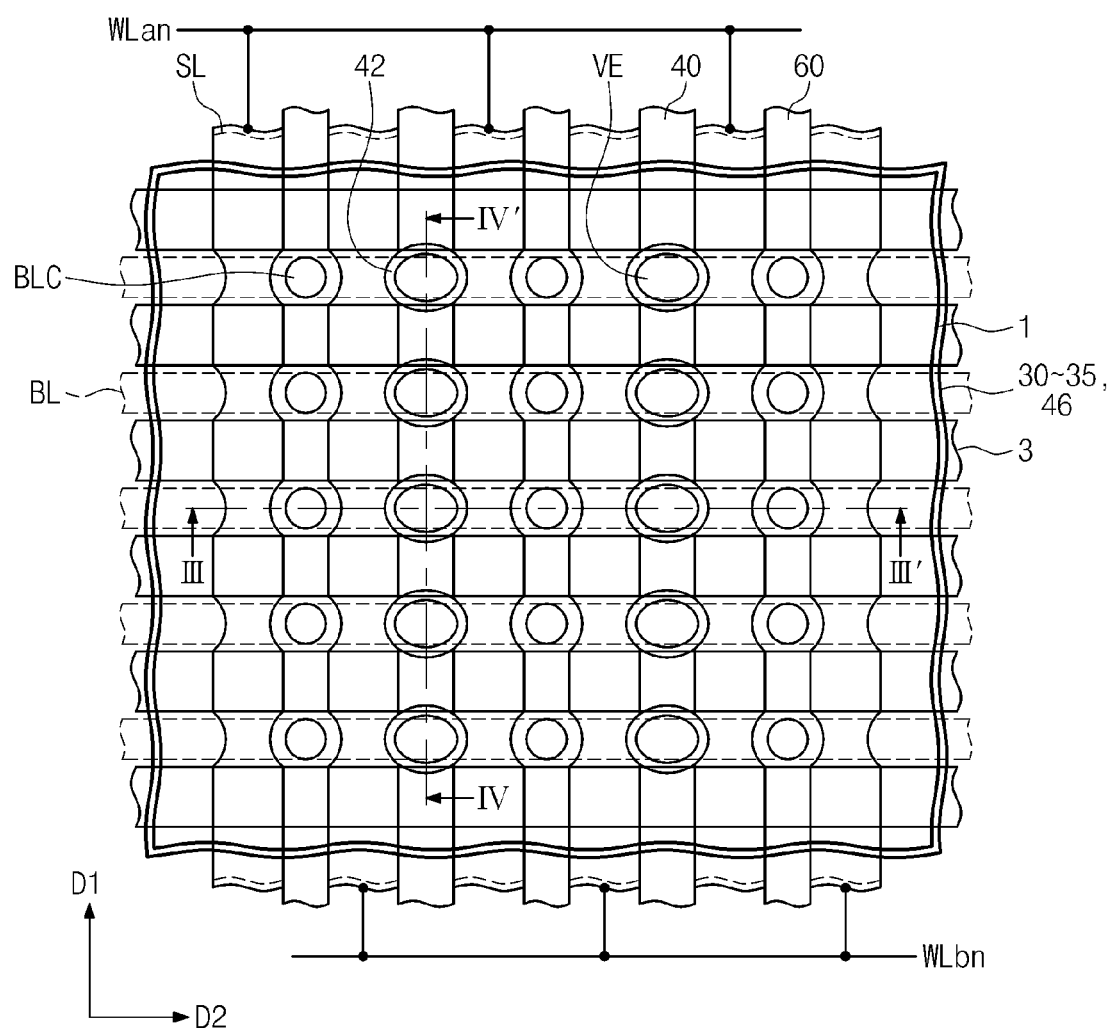
FIG. 2A is a layout illustrating a variable resistance memory device according to example embodiments of inventive concepts.
Figure 2B:
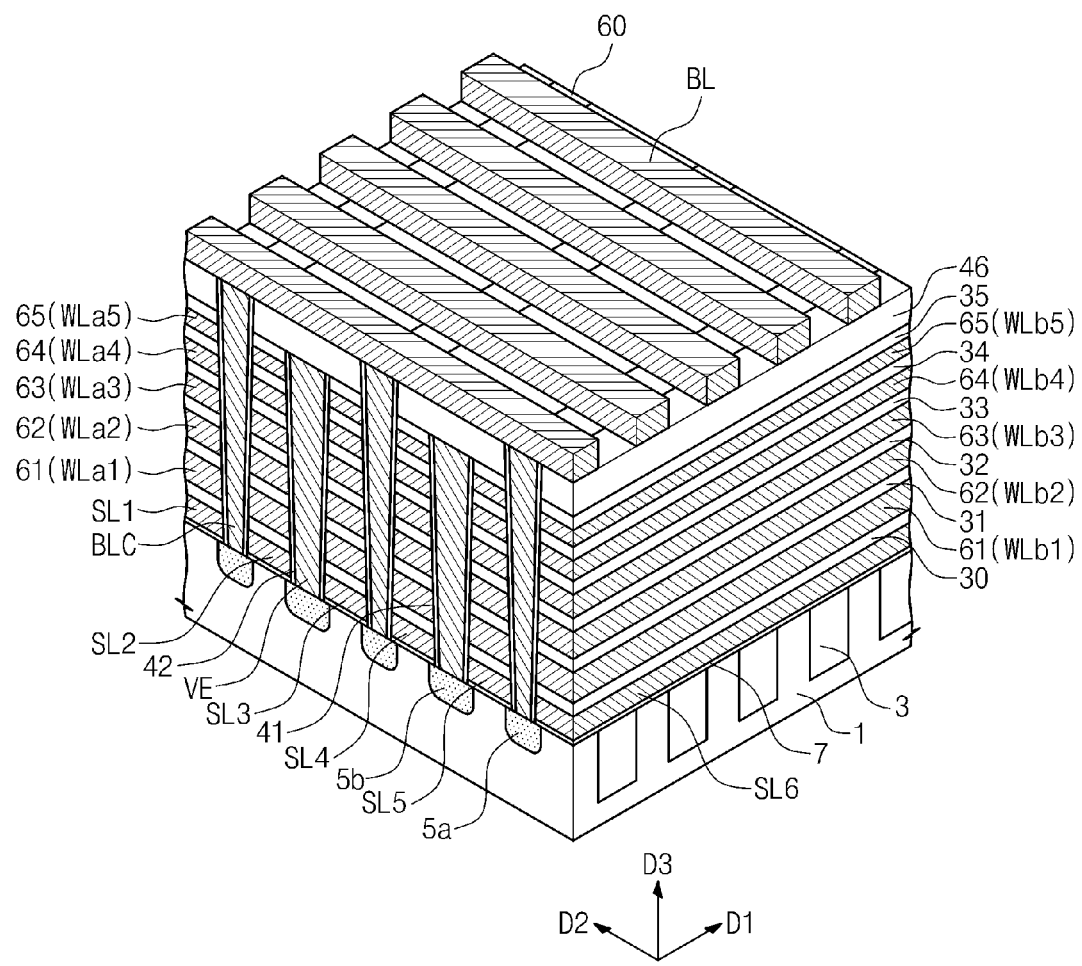
FIG. 2B is a perspective view of a variable resistance memory device of FIG. 2A.
Figure 3A:
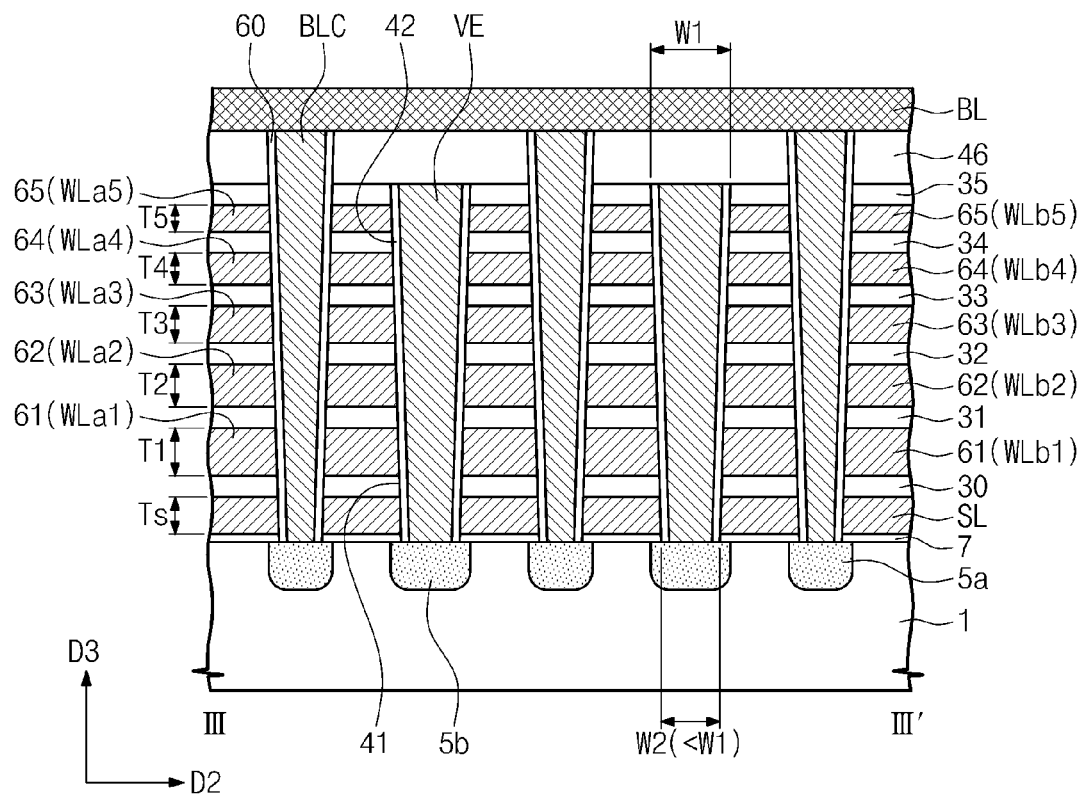
FIGS. 3A and 4 are sectional views taken along lines III-III' and IV-IV' of FIG. 2A, respectively.
Figure 4:
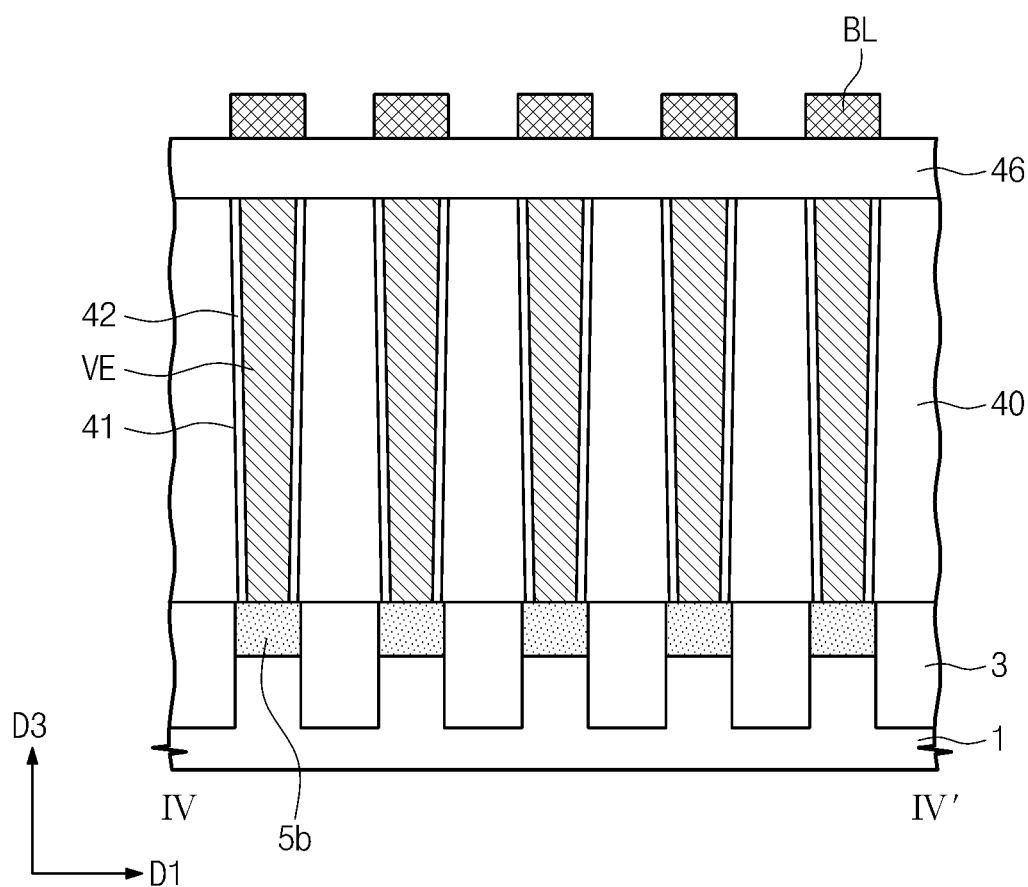

FIG. 2a is a layout illustrating variable resistance memory devices according to example embodiments of inventive concepts. FIG. 2A is a layout illustrating a variable resistance memory device according to example embodiments of inventive concepts. FIGS. 3A and 4 are sectional views taken along lines III-III' and IV-IV' of FIG. 2A, respectively. FIG. 2B is a perspective view of a variable resistance memory device, which may be configured to have a layout and a sectional view depicted in FIG. 2A.

Referring to FIGS. 2A, 2B, 3A and 4, a plurality of device isolation layers 3 may be formed in a substrate 1, and the device isolation layers 3 may be shaped like lines parallel to each other. The device isolation layers 3 may extend along the second direction D2. First doped regions 5a and second doped regions 5b may be alternatingly arranged in the substrate 1 between the device isolation layers 3. A selection gate insulating layer 7 may be provided on the substrate 1. Selection lines SL and a first insulating layer 30 may be sequentially provided on the selection gate insulating layer 7. The selection lines SL may extend along the first direction D1 and be parallel with each other. In example embodiments, each of the selection transistors ST may include one of the selection lines SL, the selection gate insulating layer 7 disposed thereunder, the first and second doped regions 5a and 5b adjacent thereto. A portion of the substrate 1 below the selection line SL and between the first and second doped regions 5a and 5b may serve as a channel region. The first doped region 5a may correspond to the first node N1, and the second doped region 5b may correspond to the second node N2.

A plurality of horizontal electrode layers and a plurality of word line interlayered insulating layers may be alternatingly disposed on the first insulating layer 30. In example embodiments, the horizontal electrode layers may include first to fifth horizontal electrode layers 61, 62, 63, 64, and 65, and the word line interlayered insulating layers may include first to fifth word line interlayered insulating layers 31, 32, 33, 34, and 35. The first to fifth horizontal electrode layers 61, 62, 63, 64, and 65 may be formed to have first to fifth thicknesses T1, T2, T3, T4, and T5, respectively. In example embodiments, the horizontal electrode layer may have a thickness increasing with decreasing a level thereof (i.e., T1>T2>T3>T4>T5). The selection line SL may have a thickness Ts independent of the thicknesses of the first to fifth horizontal electrode layers 61, 62, 63, 64, and 65. For example, the thickness Ts of the selection line SL may be thinner than the first thickness T1 of the lowermost layer (e.g., the first horizontal electrode layer 61) and be thicker than the fifth thickness T5 of the uppermost layer (e.g., the fifth horizontal electrode layer 65).

Furthermore, each of the horizontal electrode layers 61, 62, 63, 64, and 65 may include a plurality of word lines WLan and WLbn, which may be disposed on a single plane to be parallel to the first direction D1, where n denotes a stacking order of the word line and n may an integer greater than 1. For example, the first horizontal electrode layer 61, which is most adjacent to the substrate 1, may include the first odd-numbered word lines WLa1 and the first even-numbered word lines WLb1. The second horizontal electrode layer 62 disposed on the first horizontal electrode layer 61 may include the second odd-numbered word lines WLa2 and the second even-numbered word lines WLb2. The third horizontal electrode layer 63 disposed on the second horizontal electrode layer 62 may include the third odd-numbered word lines WLa3 and the third even-numbered word lines WLb3. The fourth horizontal electrode layer 64 disposed on the third horizontal electrode layer 63 may include the fourth odd-numbered word lines WLa4 and the fourth even-numbered word lines WLb4. The fifth horizontal electrode layer 65, which is the uppermost layer of the horizontal electrode layers, may include the fifth odd-numbered word lines WLa5 and the fifth even-numbered word lines WLb5. In each level, the odd-numbered word lines WLan may be electrically connected to each other, while even-numbered word lines WLbn may be electrically connected to each other and be electrically isolated from the odd-numbered word lines WLan. Furthermore, ones of the word lines WLan and WLbn vertically separated from each other may be electrically isolated from each other. For example, the even-numbered word lines WLbn on a specific level may be electrically isolated from others disposed thereon or thereunder. Example embodiments of inventive concepts are not limited to five horizontal electrode layers 61-65.

The vertical electrode VE may penetrate the word line interlayered insulating layers 31, 32, 33, 34, and 35 between the odd-numbered word lines WLan and the even-numbered word lines WLbn and be in contact with the second doped region 5b. A variable resistance layer 42 may be interposed between the vertical electrode VE and the horizontal electrode layer 61-65. The variable resistance layer 42 may include a phase-changeable material, a transition metal oxide, a ferroelectric material, or a magnetic material. According to a material of the variable resistance layer 42, the variable resistance memory device may be realized as one of a phase-change random access memory (PRAM), a resistance RAM (RRAM), a ferroelectric RAM (FRAM) or a magnetic RAM (MRAM). the variable resistance layer 42 may extend between the vertical electrode VE and the word line interlayered insulating layers 31, 32, 33, 34, and 35. The vertical electrode VE and the variable resistance layer 42 may be disposed in a vertical electrode hole 41. An upper width W1 of the vertical electrode hole 41 may be greater than a lower width W2 thereof. The vertical electrode hole 41 may have a width decreasing with increasing a depth from the top entrance.

A second insulating layer 46 may be provided on the fifth word line interlayered insulating layer 35. A plurality of the bit lines BL may be provided on the second insulating layer 46 to be parallel to each other or to the second direction D2.

Referring to FIGS. 2A, 3A and 4, a first insulating gap-fill layer 40 may be interposed between the vertical electrodes VE in the first direction D1. The variable resistance layer 42 may extend between the first insulating gap-fill layer 40 and the vertical electrode VE. A second insulating gap-fill layer 60 may be disposed between the vertical electrodes VE, which are adjacent to each other in the second direction D2, and be spaced apart from the vertical electrodes VE. The second insulating gap-fill layer 60 may include a plurality of line shaped patterns extending along the first direction D1 and being parallel to each other. In example embodiments, the second insulating gap-fill layer 60 may separate the word lines WLan and WLbn from the selection lines SL. The second insulating gap-fill layer 60 may penetrate the second insulating layer 46, the word line interlayered insulating layers 31-35, the first insulating layer 30, the selection line SL, and the selection gate insulating layer 7 to be in contact with the bit line BL and the first doped regions 5a between the odd-numbered word lines WLan and the even-numbered word lines WLbn. A plurality of bit line contacts BLC spaced apart from each other may be provided in the second insulating gap-fill layer 60 to connect the bit line BL electrically to the first doped regions 5a.

In example embodiments of inventive concepts, the thicknesses T1-T5 of the horizontal electrode layers 61-65 and a profile of the vertical electrode hole 41 may be configured in such a way that the memory cells MC may have constancy in contact area between the word lines WLan and WLbn and the variable resistance layer 42. This enables to reduce dispersion in electric characteristics of memory cells (for example, dispersion in read or program current of memory cells). Hereinafter, this will be described in more detail.

Figure 5:
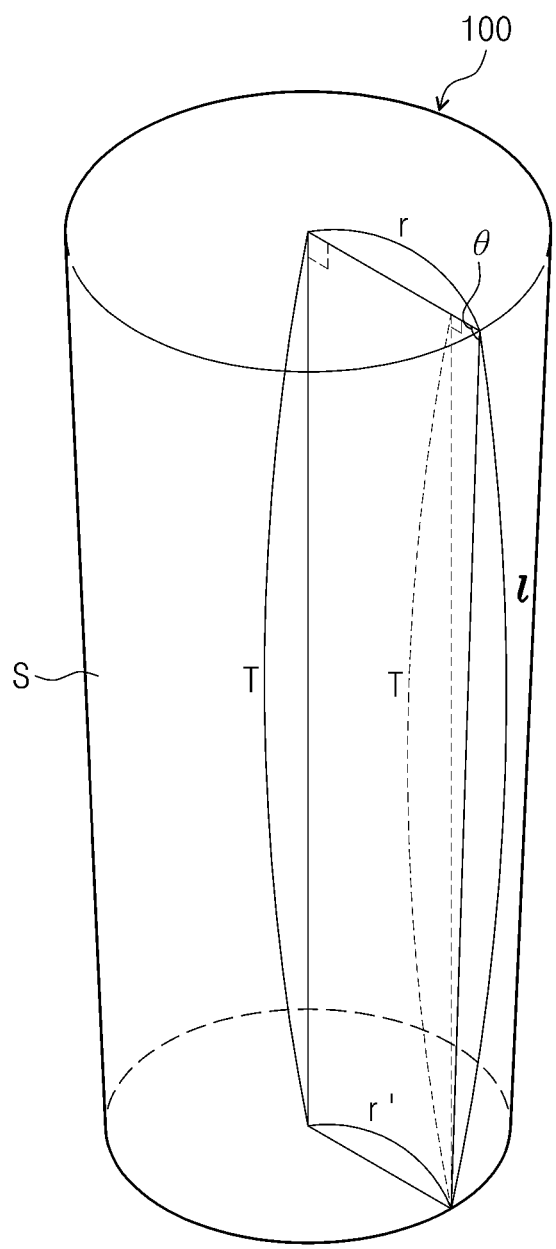
FIG. 5 is a perspective view of a truncated conical pillar according to example embodiments of inventive concepts.
Figure 6:
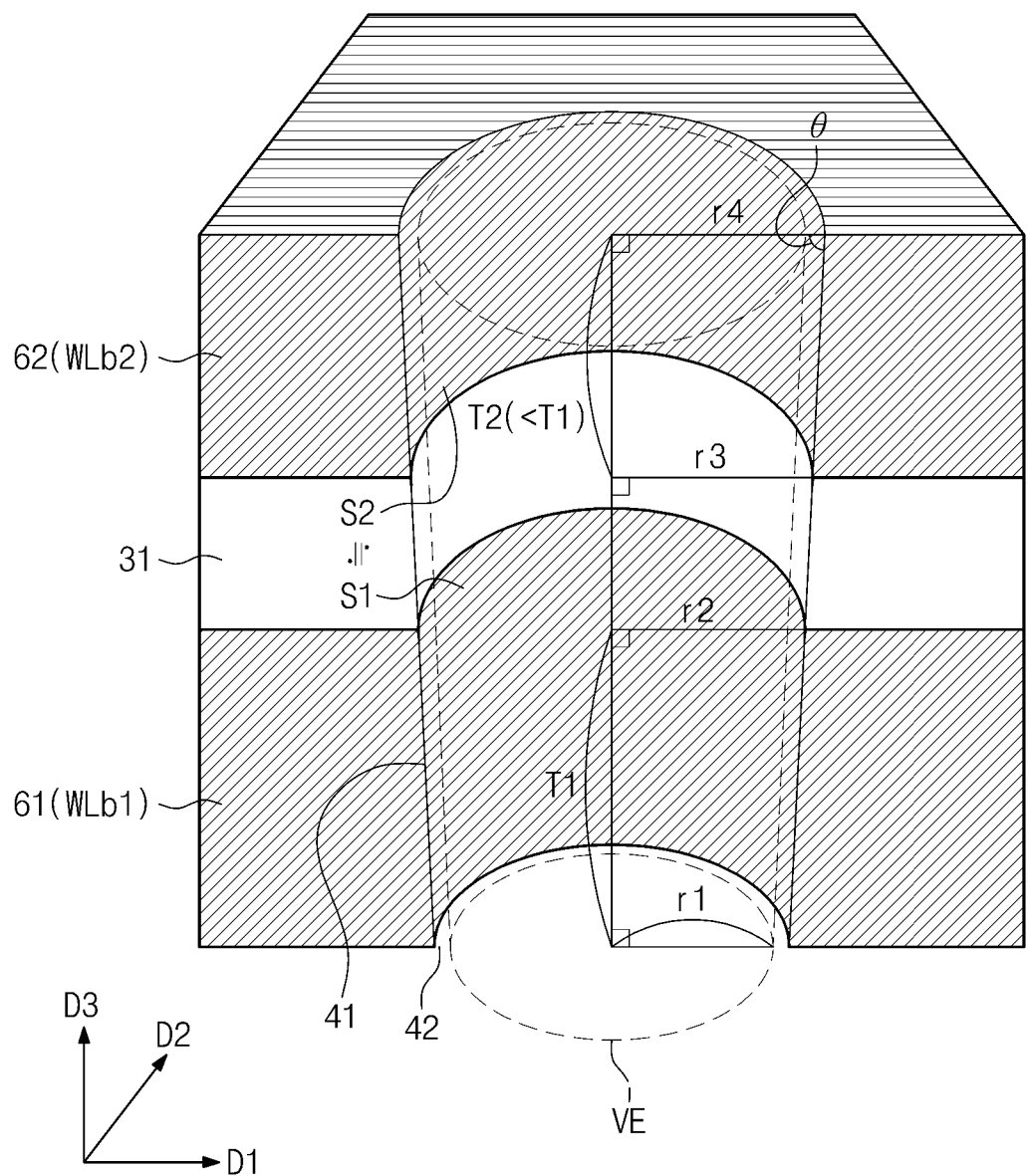
FIG. 6 is an enlarged perspective view of a portion of the variable resistance memory device of FIG. 2B.

FIG. 5 is a perspective view of a truncated conical pillar according to example embodiments of inventive concepts. FIG. 6 is an enlarged perspective view of a portion of the variable resistance memory device of FIG. 2B.

Let us consider a truncated conic pillar 100, shown in FIG. 5, which may have the same shape as the vertical electrode hole 41 described with reference to FIGS. 2A, 2B, 3A, and 4. The truncated conic pillar 100 may have a top radius of r, a bottom radius of r', which is smaller than r, a thickness of T, a slant height of 1, and an angle of θ between a top surface and the side surface. Here, the angle θ forms an acute angle. A lateral surface area S of the truncated conic pillar 100 can be given by the following equation 1.

$$S=\pi 1(r+r').$$ [Equation 1]

Since 1=T/sin θ, the lateral surface area S can be rewritten by $\pi T(r+r')/\sin \theta$.

From this result, contact areas S1 and S2 of the variable resistance layer 42 contacting with the first even-numbered word line WLb1 and the second even-numbered word line WLb2, in FIG. 6, can be given by the following equation 2.

$$S1=\pi T1(r2+r1)/\sin \theta, \text{ and}$$

$$S2=\pi T2(r4+r3)/\sin \theta,$$ [Equation 2]

Since the angle θ is the acute angle, r4+r3>r2+r1. That is, in the case of T1>T2, S1 can be similar or equivalent to S2 (i.e., S1≈S2 or S1=S2).

The angle θ of the vertical electrode hole 41 may form an acute angle, when an anisotropic etching process is, for example, used to form the vertical electrode hole 41. In the case in which the horizontal electrode layers 61-65 have the same thickness, unlike the example embodiments of inventive concepts, the contact area S1 of the first even-numbered word line WLb1 may be smaller than the contact area S2 of the second even-numbered word line WLb2, owing to the result of 4+r3>r2+r1. That is, the contact area of the variable resistance layer 42 may vary from memory cell to memory cell, and this leads to a great increase in dispersion of electric characteristics of the memory cells. By contrast, according to example embodiments of inventive concepts, thicknesses of horizontal electrode layers 61 and 65 may increase with decreasing a vertical level thereof, and this enables to maintain the contact areas between the word lines WLan and WLbn and the variable resistance layer 42 to a substantially constant value and to reduce the dispersion of electric characteristics of the memory cells.

FIG. 7A through 7G are layout diagrams illustrating a process of fabricating a variable resistance memory device (e.g., of FIG. 2A) according to example embodiments of inventive concepts. FIG. 8A through 8G are sectional views illustrating a process of fabricating a variable resistance memory device (e.g., of FIG. 3A) according to example embodiments of inventive concepts, taken along lines VIII-VIII' of FIGS. 7A to 7G respectively. FIG. 9A through 9E are sectional views illustrating a process of fabricating a variable resistance memory device (e.g., of FIG. 4) according to example embodiments of inventive concepts, taken along lines IX-IX' of FIGS. 7A to 7G respectively.

Figure 7A:
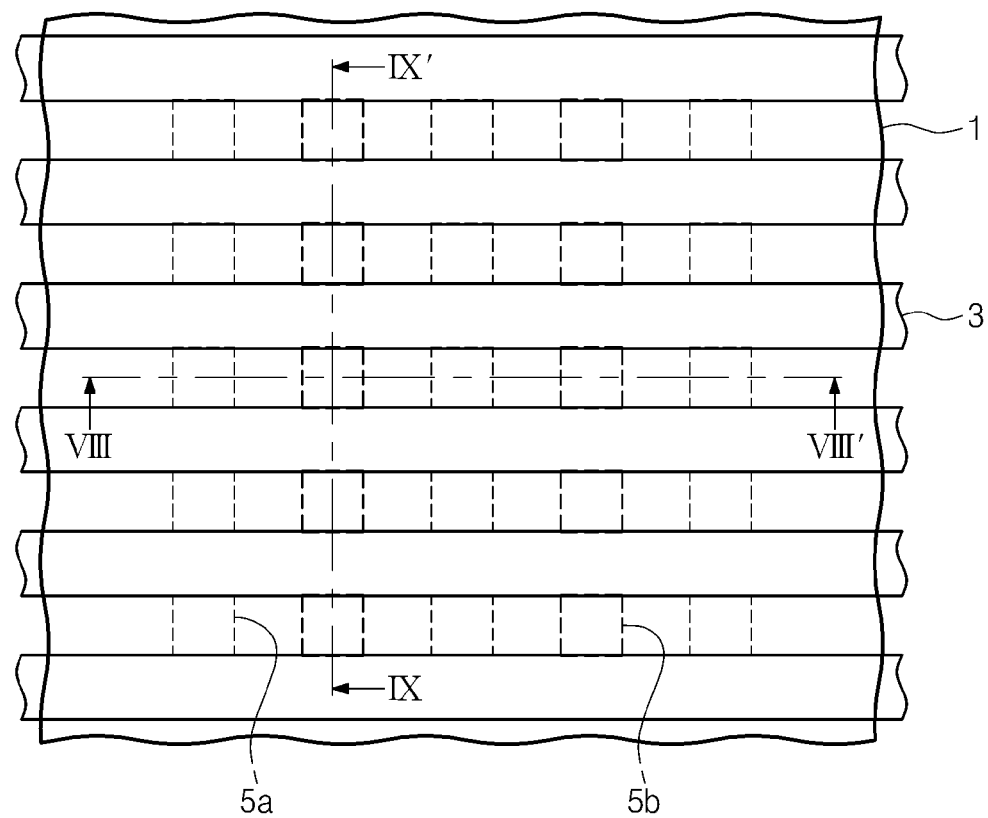
FIG. 7A through 7G are layout diagrams illustrating a process of fabricating a variable resistance memory device (e.g., of FIG. 2A) according to example embodiments of the inventive concept.
Figure 8A:
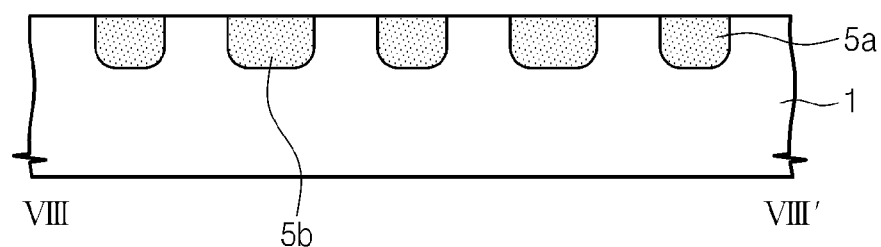
FIG. 8A through 8G are sectional views illustrating a process of fabricating a variable resistance memory device (e.g., of FIG. 3) according to example embodiments of inventive concepts, taken along lines VIII-VIII' of FIGS. 7A through 7G respectively.
Figure 9A:
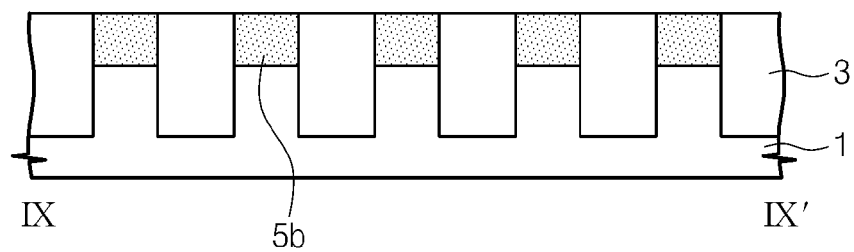
FIGS. 9A through 9E are sectional views illustrating a process of fabricating a variable resistance memory device (e.g., of FIG. 4) according to example embodiments of inventive concepts, taken along lines IX-IX' of FIGS. 7A through 7G respectively.

Referring to FIGS. 7A, 8A, and 9A, a plurality of the device isolation layers 3 extending along the second direction D2 may be formed in the substrate 1 to be parallel to each other. The substrate 1 may be one of a single-crystalline silicon substrate, a silicon-on-insulator (SOI) substrate, or a silicon epitaxial layer. The device isolation layers 3 may be formed using, for example, a shallow trench isolation (STI) process. The device isolation layers 3 may be formed to define active regions. An ion implantation process may be performed to form a plurality of the first and second doped regions 5a and 5b, which may be shaped like island and be provided in the active region between the device isolation layers 3. The second doped region 5b may be formed to have a width greater than the first doped region 5a.

Figure 7B:
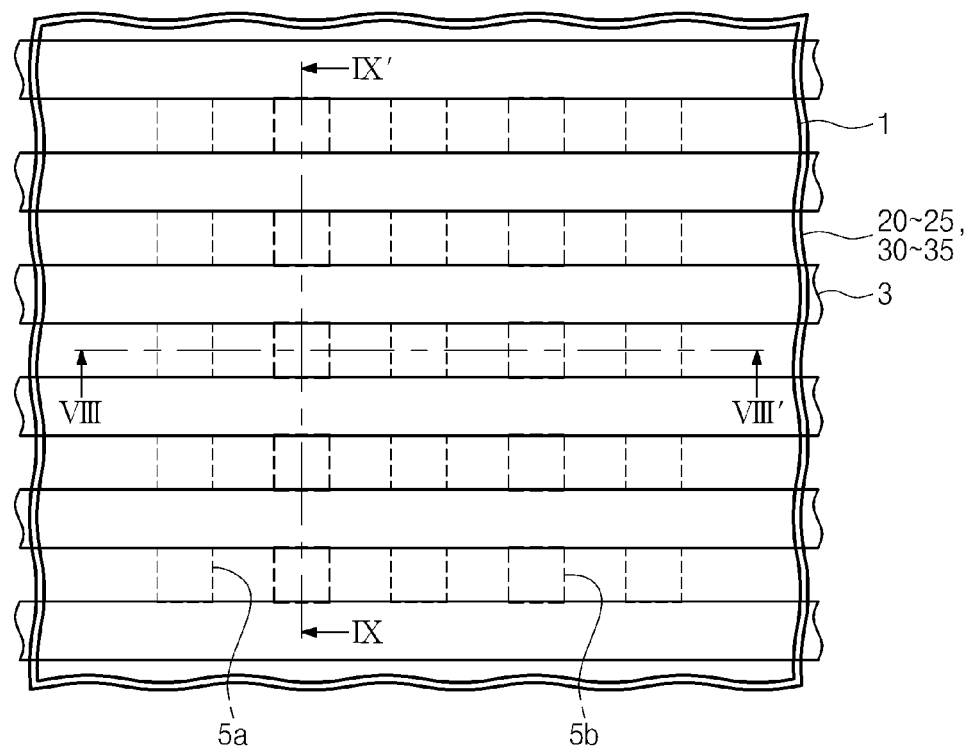
Figure 8B:
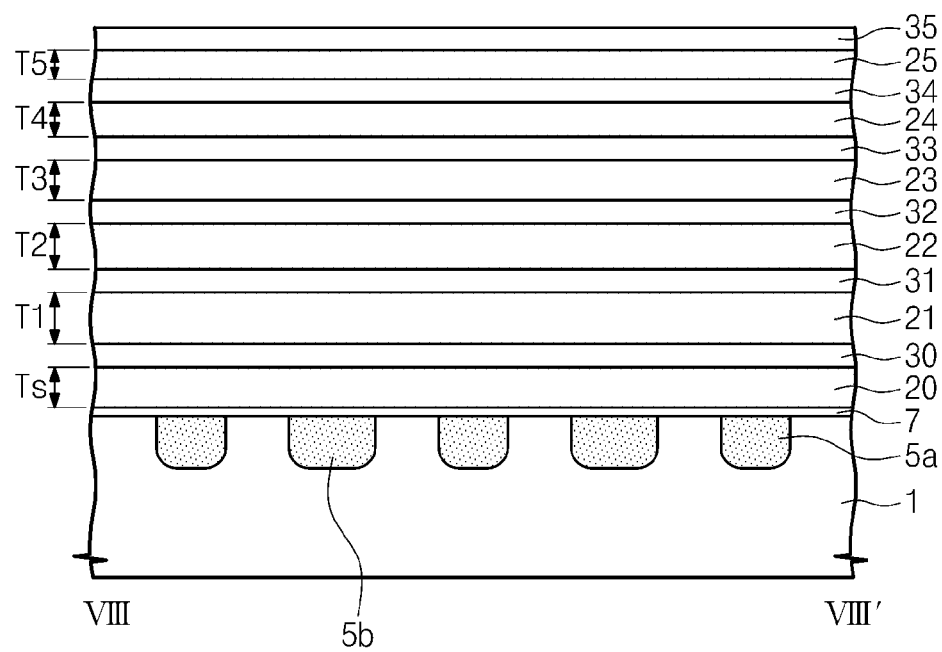
Figure 9B:
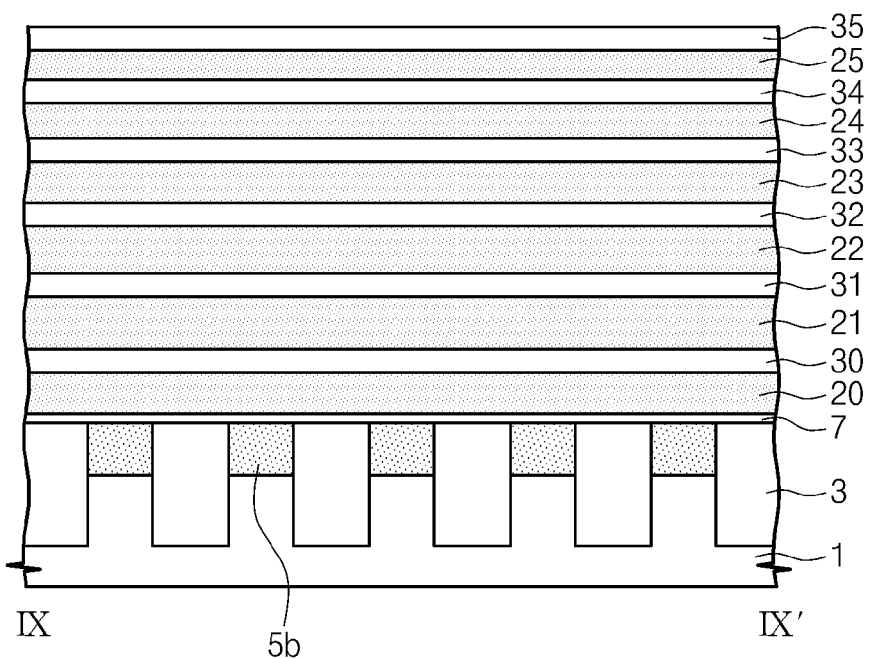

Referring to FIGS. 7B, 8B, and 9B, the selection gate insulating layer 7, a selection sacrificial layer 20, the first insulating layer 30, first to fifth sacrificial layers 21-25, and the word line interlayered insulating layers 31-35 may be sequentially stacked on the substrate 1. the sacrificial layers 20-25 may be formed of materials having etch selectivity with respect to the insulating layers 30-35. For example, the sacrificial layers 20-25 may be formed of a silicon nitride layer, the insulating layers 30-35 may be formed of a silicon oxide layer. The selection sacrificial layer 20 may be formed to have a thickness corresponding to the thickness Ts of the selection line SL. The first to fifth sacrificial layers 21-25 may be formed to have thicknesses corresponding to the thicknesses T1-T5 of the first to fifth horizontal electrode layers 61-65, respectively.

Figure 7C:
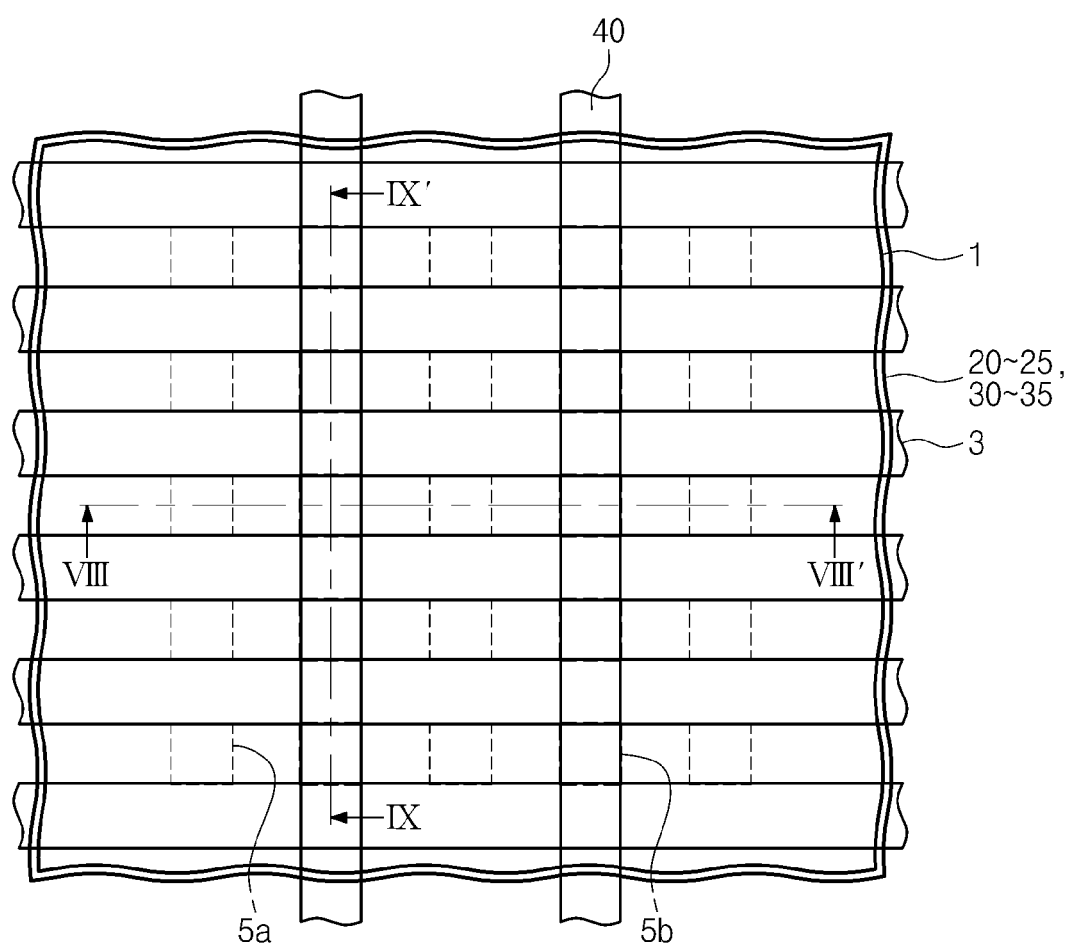
Figure 8C:
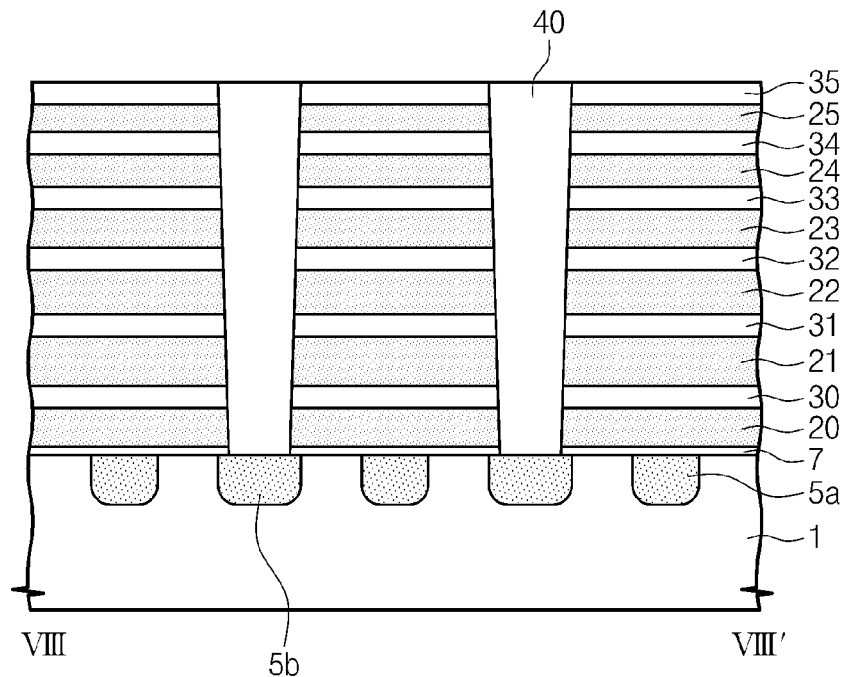
Figure 9C:
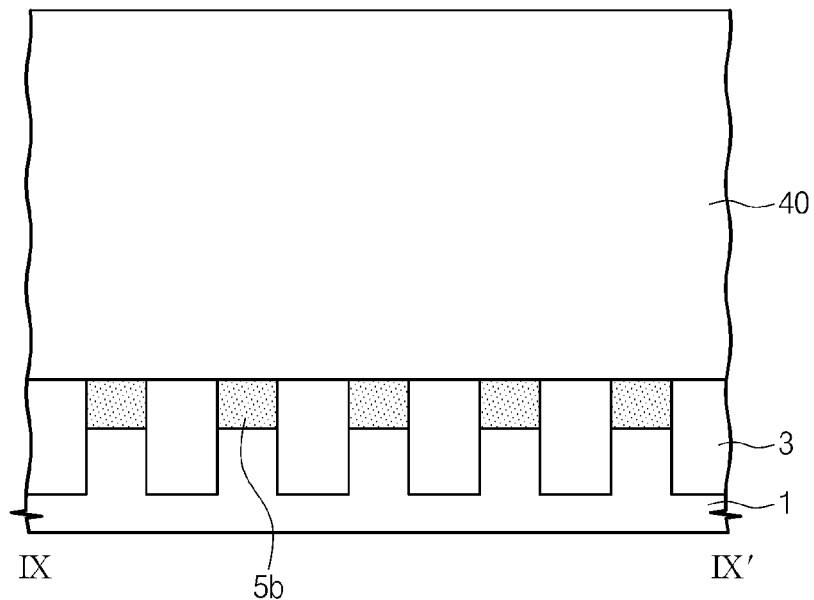

Referring to FIGS. 7C, 8C, and 9C, the sacrificial layers 20-25, the insulating layers 30-35, and the selection gate insulating layer 7 may be patterned to form grooves, and the first insulating gap-fill layer 40 may be formed in the groove to be in contact with the second doped region 5b. The first insulating gap-fill layer 40 may be formed to include a plurality of line-shaped patterns extending along the first direction D1 and being parallel to each other. In example embodiments, the first insulating gap-fill layer 40 may be formed of, for example, silicon oxide materials.

Figure 7D:
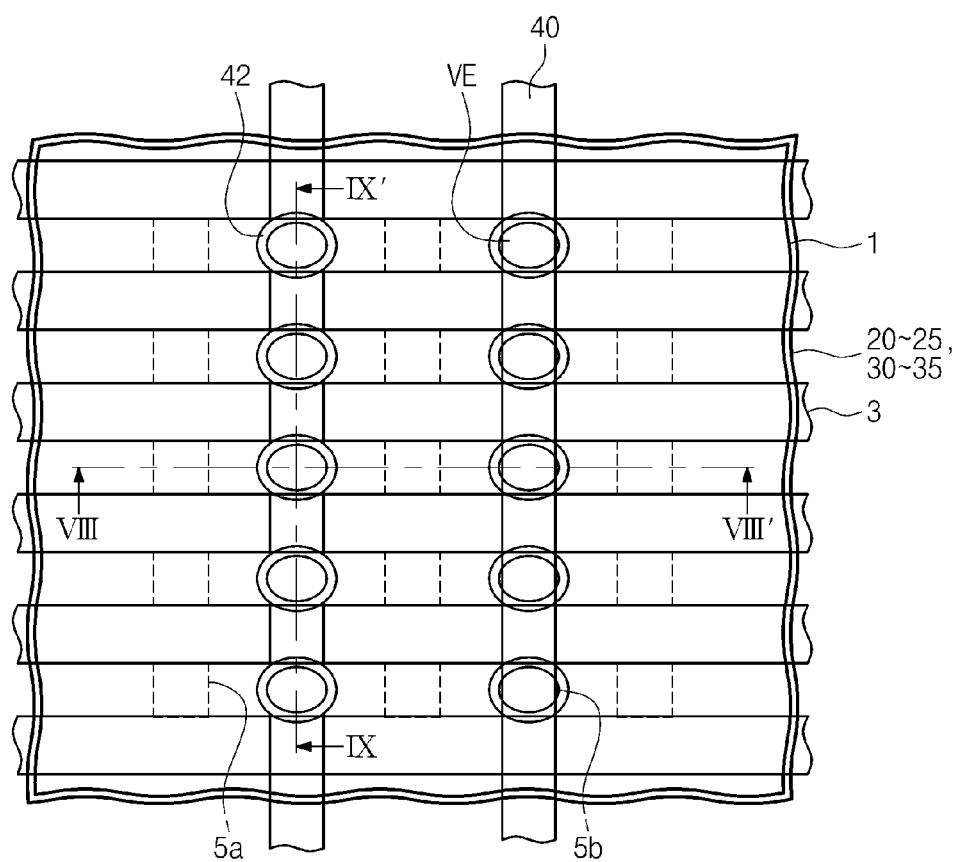
Figure 8D:
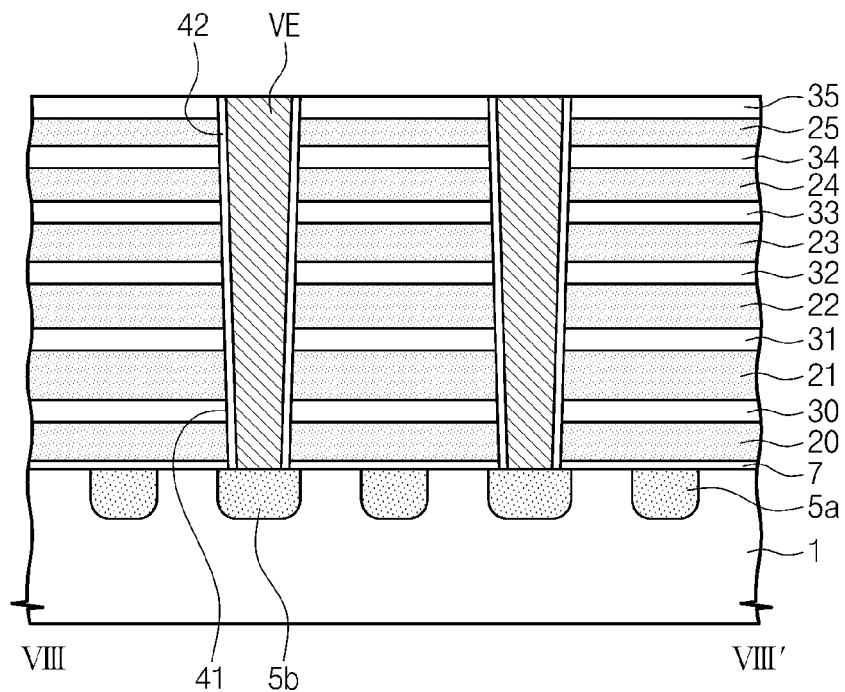
Figure 9D:
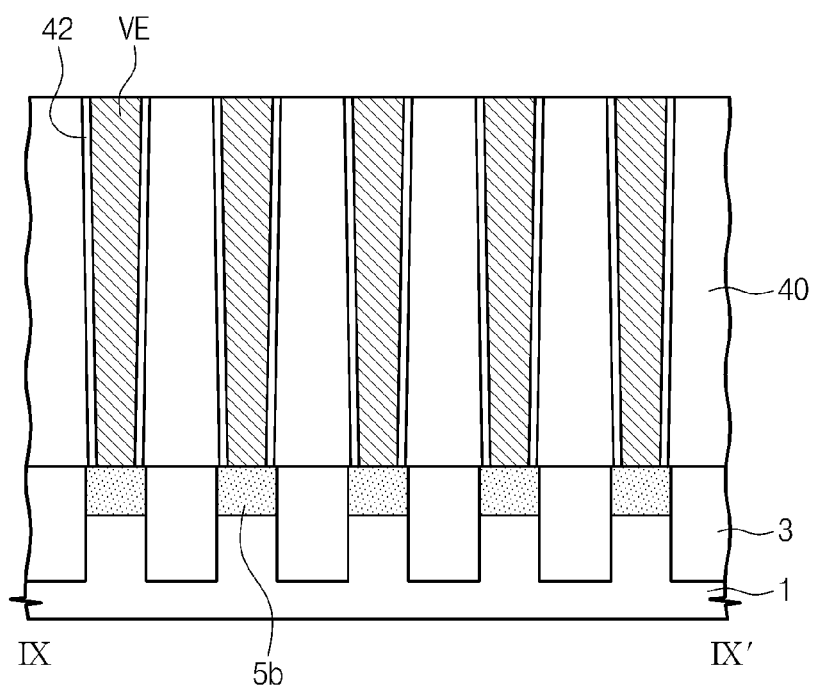

Referring to FIGS. 7D, 8D, and 9D, an anisotropic etching process may be performed to remove a portion of the first insulating gap-fill layer 40, thereby forming the vertical electrode hole 41 exposing the second doped region 5b. The vertical electrode hole 41 may be formed to have a width greater than the first insulating gap-fill layer 40. As described with reference to FIGS. 2A, 2B, 3A 4, the vertical electrode hole 41 may be formed to have the upper width greater than the lower width, as the result of the anisotropic etching process. after the formation of the vertical electrode hole 41, a deposition process and an etch-back process may be performed to form the variable resistance layer 42 covering a sidewall of the vertical electrode hole 41 and exposing a bottom of the vertical electrode hole 41. Thereafter, the vertical electrode hole 41 may be filled with a conductive layer to form the vertical electrode VE.

Figure 7E:
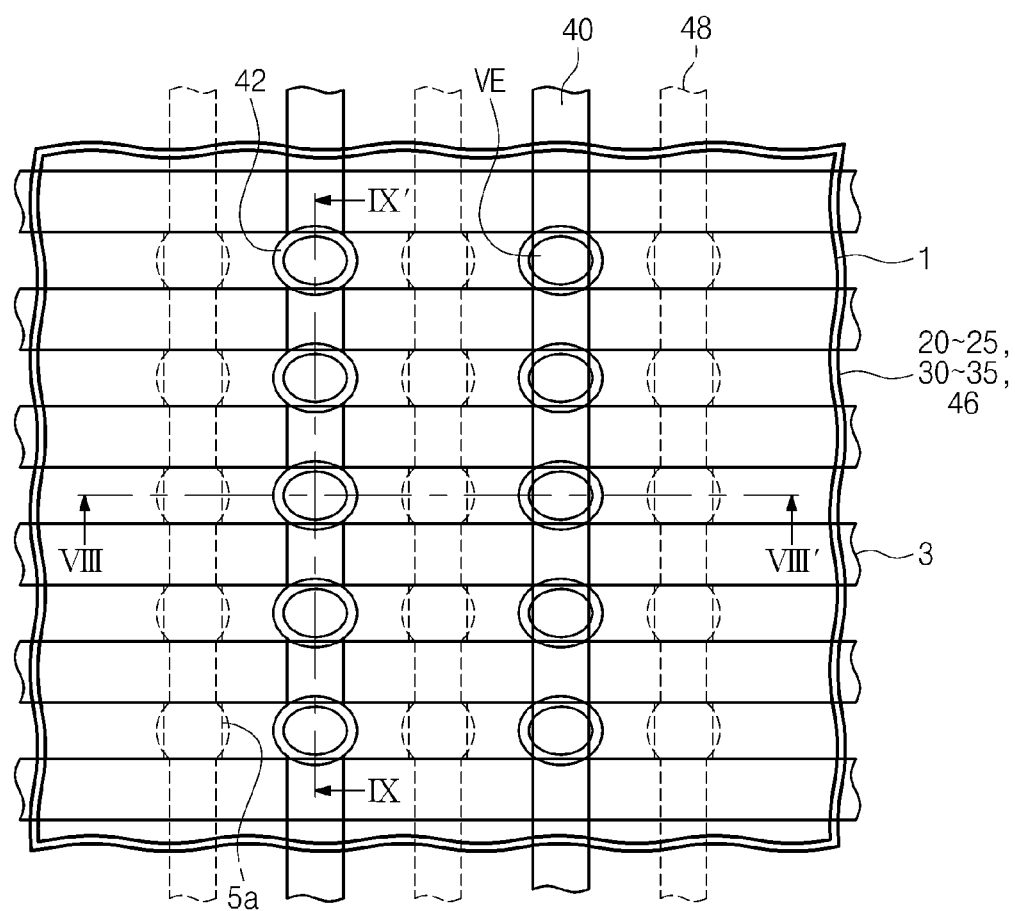
Figure 8E:
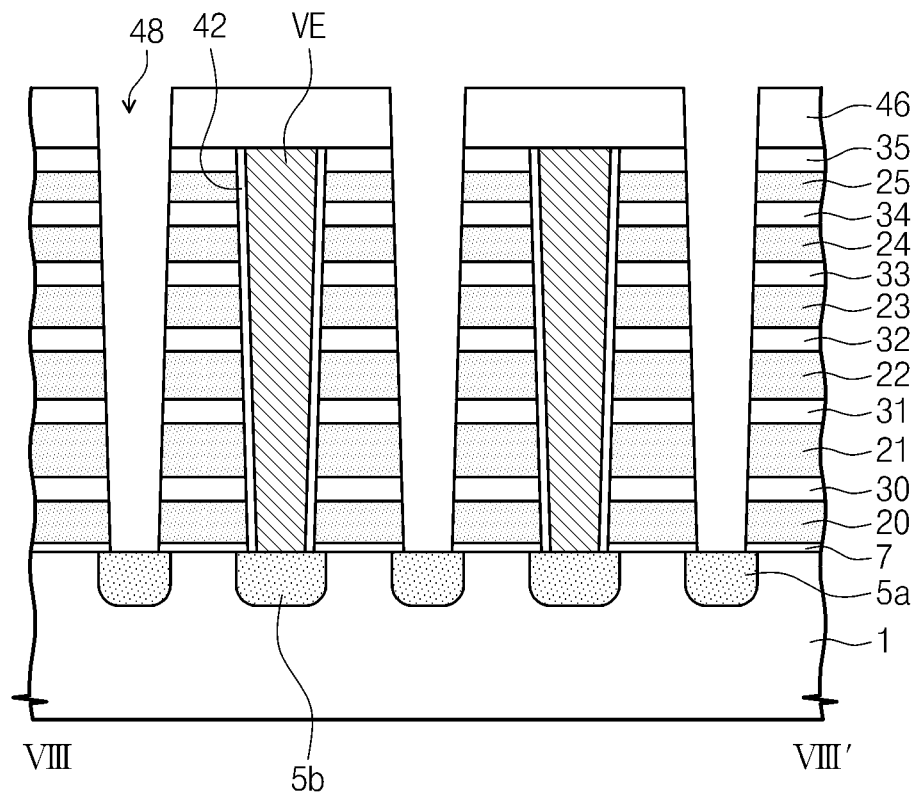
Figure 9E:
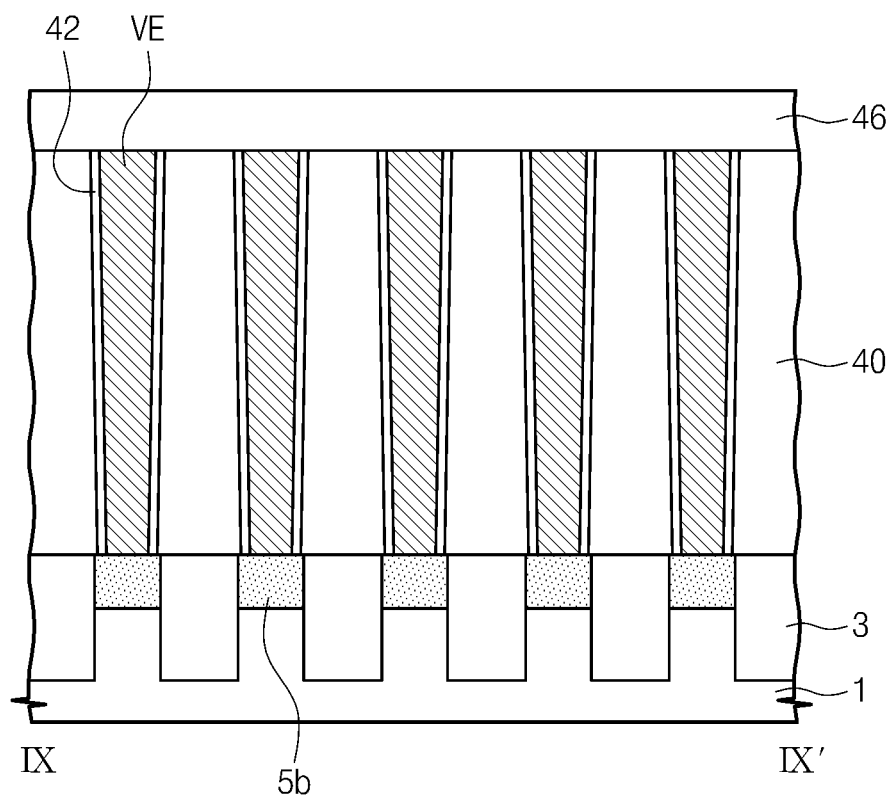

Referring to FIGS. 7E, 8E, and 9E, a second insulating layer 46 may be formed on the fifth word line interlayered insulating layer 35 to cover top surfaces of the variable resistance layer 42 and the vertical electrode VE. The insulating layers 7, 30-35, and 46 and the sacrificial layers 20-25 may be sequentially etched at positions spaced apart from the variable resistance layer 42 to form a plurality of grooves 48 exposing the first doped region 5a and extending along the first direction D1.

FIG. 9E shows sectional view taken along a line IX-IX' of FIG. 7E.

Figure 7F:
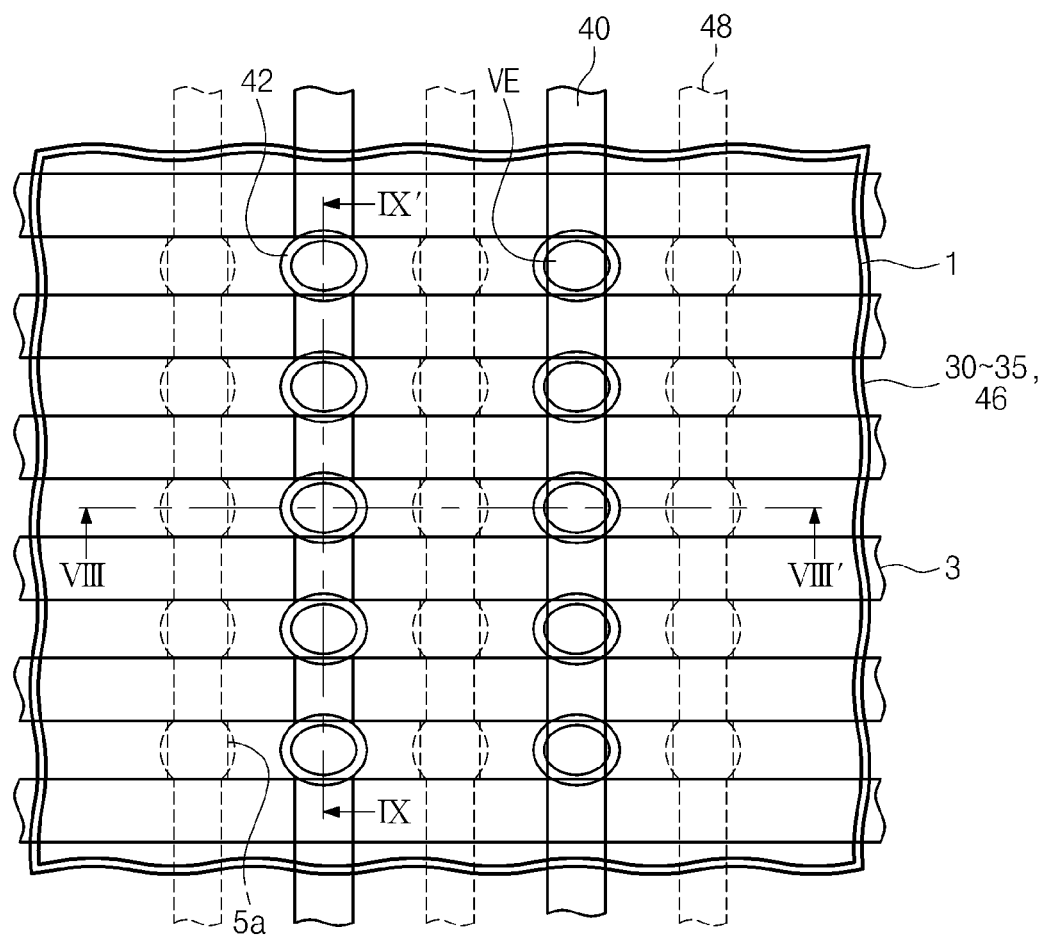
Figure 8F:
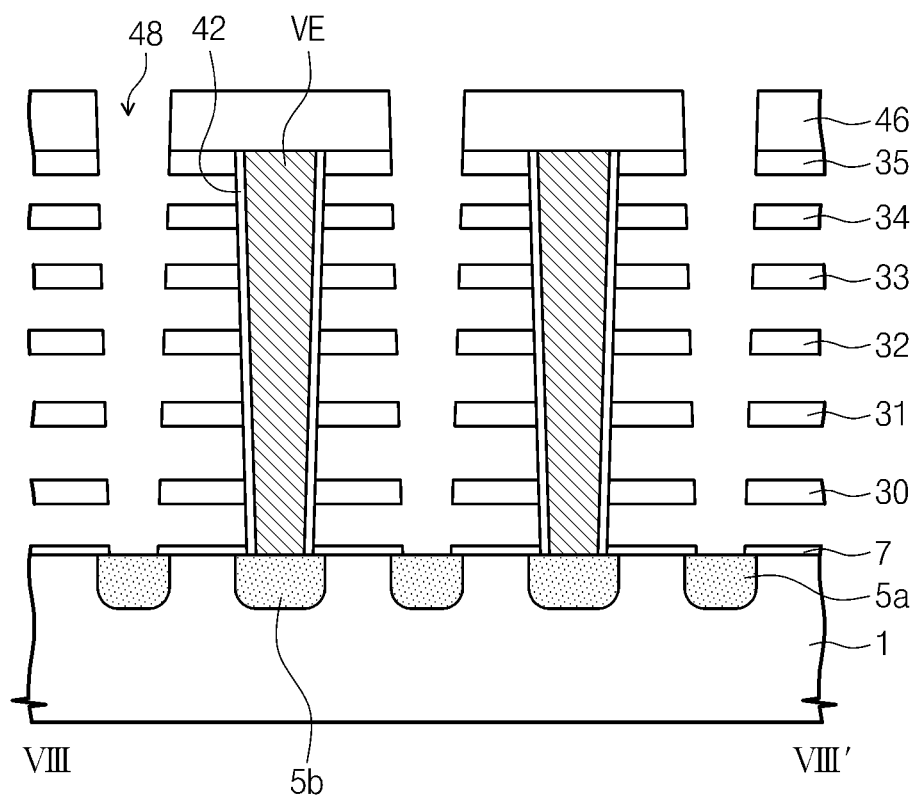

Referring to FIGS. 7F and 8F, an isotropic etching process may be performed to remove selectively the sacrificial layers 20-25 exposed by the grooves 48. As a result, bottom surfaces and side surfaces of the insulating layers 7, 30-35, and 46 may be exposed. In addition, outside surfaces of the variable resistance layers 42 may be exposed.

Figure 7G:
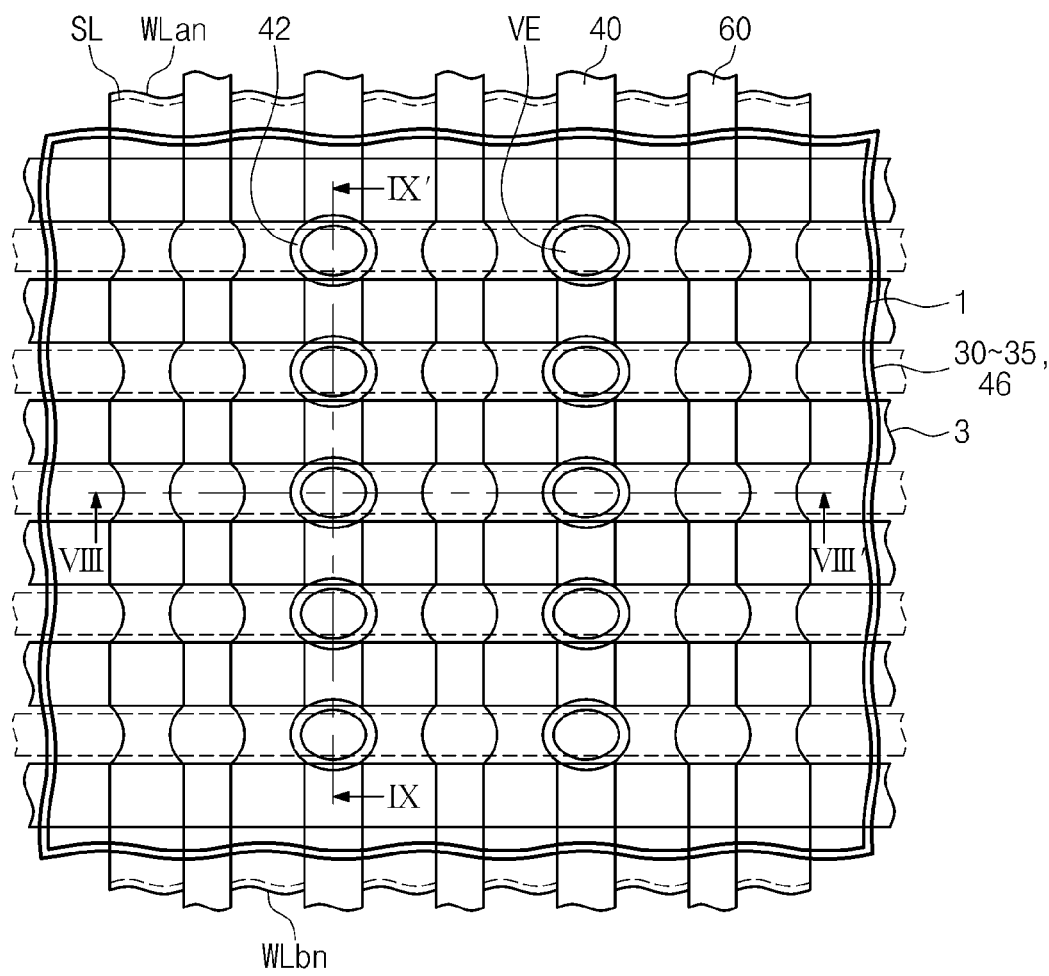
Figure 8G:
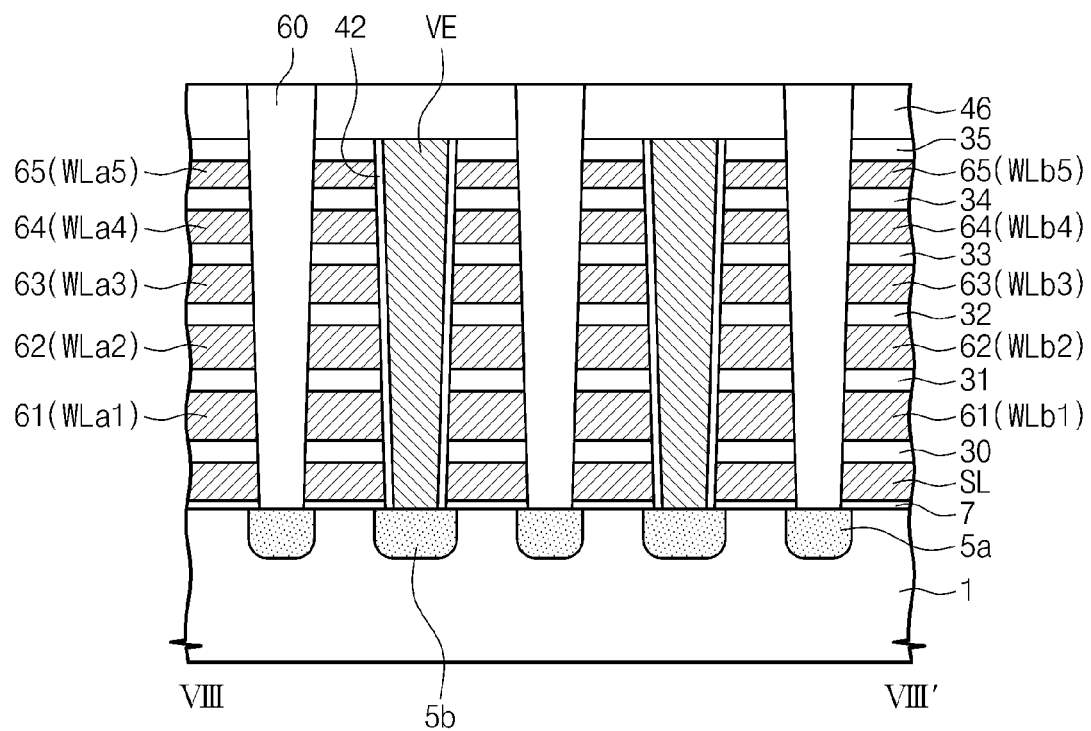

Referring to FIGS. 7G and 8G, a conductive layer may be deposited to cover the exposed outside surfaces of the variable resistance layers 42 and the exposed bottom and side surfaces of the insulating layers 7, 30-35, and 46 and to fill spaces therebetween. Thereafter, the conductive layer may be removed from the grooves 48, and the second insulating gap-fill layer 60 may be formed in the groove 48, thereby forming the word lines WLan and WLbn.

Referring back to FIGS. 2A, 2B, 3A and 4, the bit line contact BLC may be formed to be in contact with the first doped region 5a. In example embodiments, the formation of the bit line contact BLC may include removing at least a portion of the second insulating gap-fill layer 60 and forming a conductive layer therein. Thereafter, a plurality of the bit lines BL, which may be parallel to each other, may be formed on the second insulating layer 46 to be in contact with the bit line contact BLC and extend along the second direction D2.

The lower the first to fifth sacrificial layers 21-25 are positioned, the greater the thickness thereof. Thus, the lower the word lines WLan and WLbn are positioned, the greater the thickness thereof.

Figure 3B:
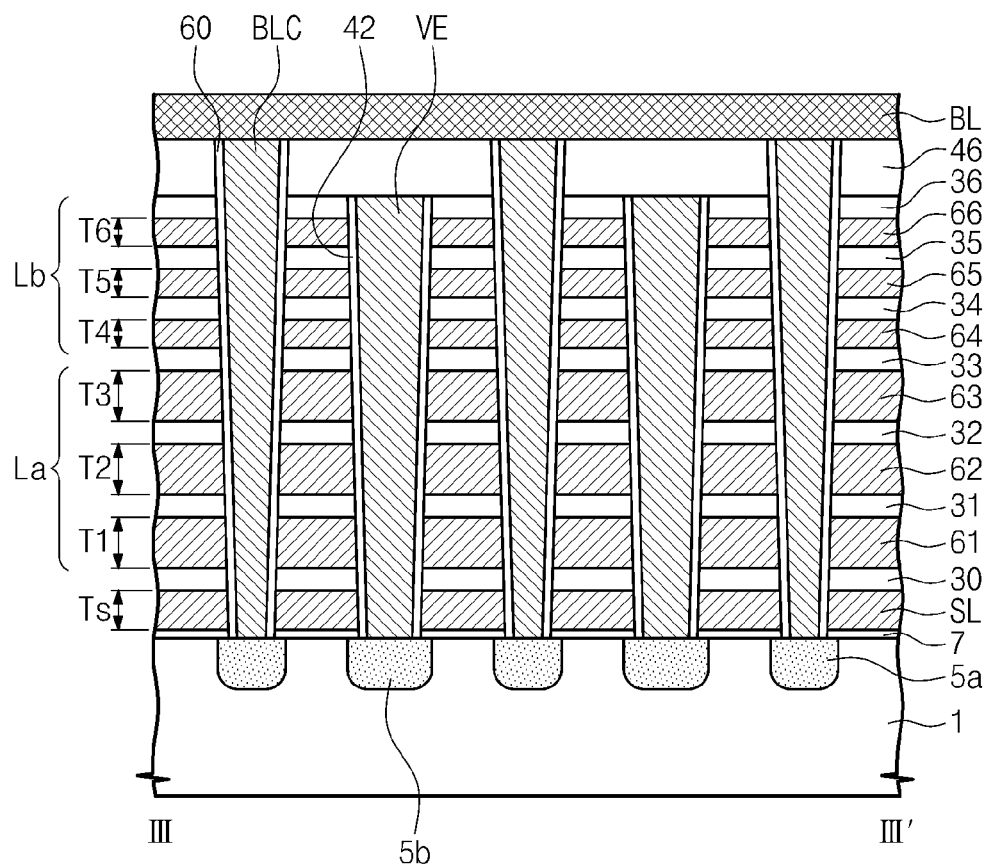
FIG. 3B is a sectional view illustrating a variable resistance memory device according to example embodiments of inventive concepts, taken along line III-III' of FIG. 2A.

FIG. 3B is a sectional view illustrating a variable resistance memory device according to example embodiments of inventive concepts, taken along line III-III' of FIG. 2A.

Referring to FIG. 3B, thicknesses of the horizontal electrode layers may be different from section to section. For example, a variable resistance memory device according to example embodiments may include a first section La and a second section Lb thereon. The first section La may include the first to third horizontal electrode layers 61-63 whose thicknesses T1-T3 are substantially equivalent to each other. The second section Lb may include the fourth to sixth horizontal electrode layers 64-66 whose thicknesses T4-T6 are substantially equivalent to each other. However, the thicknesses T4-T6 of the fourth to sixth horizontal electrode layers 64-66 in the second section Lb may be smaller than the thicknesses T1-T3 of the first to third horizontal electrode layers 61-63 in the first section La. The vertical electrode VE, the variable resistance layer 42, the bit line contact BLC, and the second insulating gap-fill layer 60 may be formed to penetrate a plurality of the sections Lb and La.

While FIG. 3B illustrates a sectional view of a variable resistance memory device, where the thicknesses of the horizontal electrode layers 61-63 in the first section La are substantially equivalent and the thicknesses of the horizontal layers 64-66 in the second section Lb are substantially equivalent, example embodiments are not limited thereto. For example, although not shown, a variable resistance memory device according to example embodiments may include at least one section of horizontal electrodes having substantially equivalent thicknesses and at least one section of horizontal electrodes having successively decreasing thicknesses from bottom to top. For example, a variable resistance memory device according to example embodiments may include a first section where each horizontal electrode is thinner than the horizontal electrode beneath it (such as the first section La illustrated in FIG. 3C) and a second section of horizontal electrodes where each horizontal electrode has a substantially equivalent thicknesses (such as the second section Lb in FIG. 3B). Alternatively, a variable resistance memory device according to example embodiments may include a first section where each horizontal electrode has a substantially equivalent thickness (such as the first section La illustrated in FIG. 3B) and a second section of horizontal electrodes where each horizontal electrode is thinner than the horizontal electrode beneath it (such as the second section Lb illustrated in FIG. 3C). Alternatively, although not shown, a variable resistance memory device according to example embodiments may be the same as the variable resistance memory device illustrated in FIG. 3B, except for a third section of horizontal electrodes may be between the first section La and the second section Lb, and the third section of horizontal electrodes may be a section where each horizontal electrode is thinner than the horizontal electrode beneath it and thicker than the horizontal electrode above it.

Example embodiments of inventive concepts are not be limited the example in which the number of the sections is two. For example, the number of the sections may be three or more. Even in the case of three or more sections, thicknesses of the horizontal electrode layers may be equivalent to each other in one section but be different from those in other section. For example, the horizontal electrode layer(s) in a lower section may be thicker than the horizontal electrode layer(s) in an upper section. A difference in thickness of the horizontal electrode layer between the sections may be configured in such a way that dispersion of the contact areas between the horizontal electrodes and the variable resistance layer 42 may be in an allowable range.

Except for the above-described differences, the variable resistance memory device illustrated in FIG. 3B can be configured to have the same or similar technical features as the afore-described variable resistance memory devices according to example embodiments in FIGS. 3A and 4.

Figure 3C:
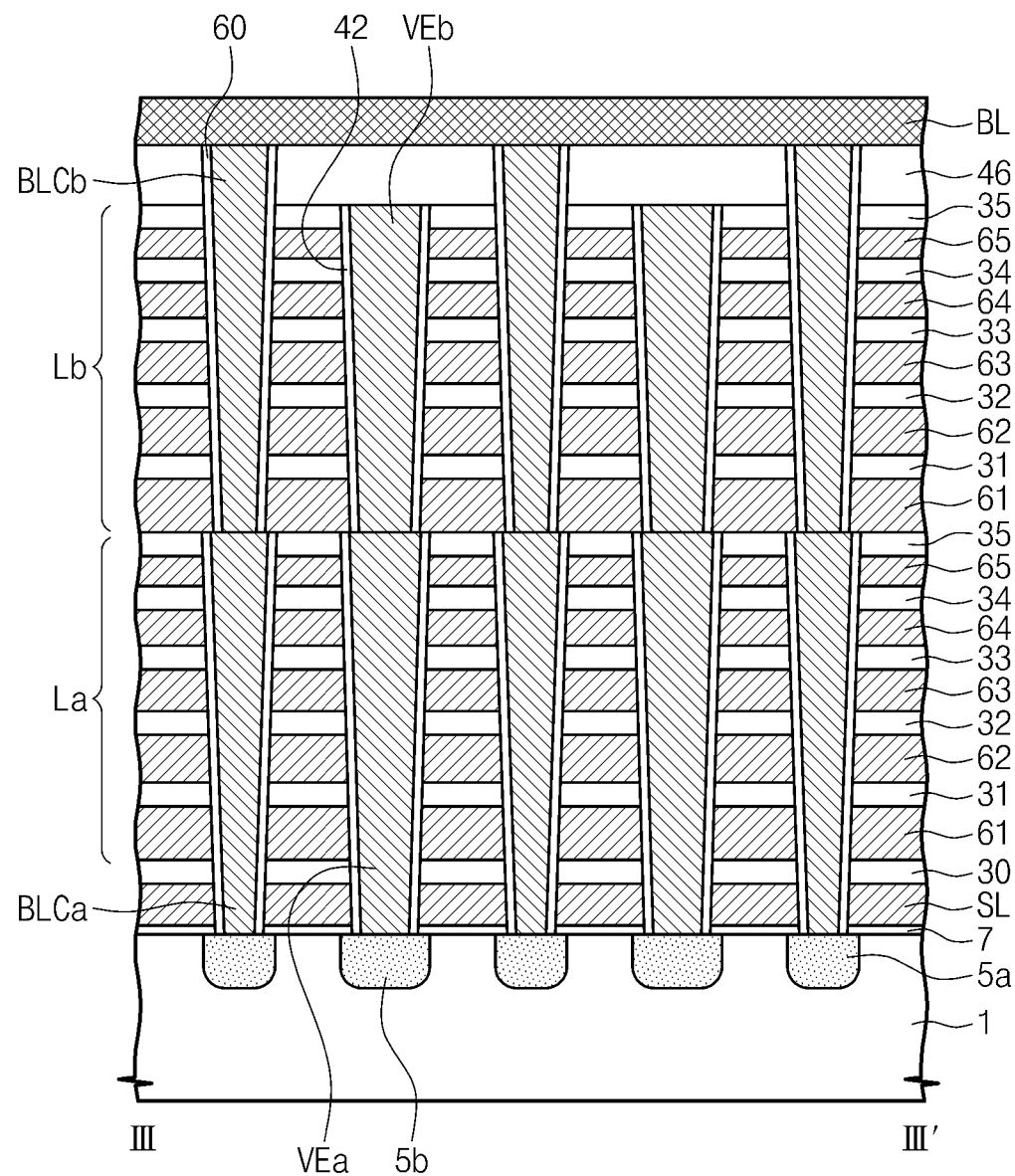
FIG. 3C is a sectional view illustrating a variable resistance memory device according to still other example embodiments of inventive concepts, taken along line III-III' of FIG. 2A.

FIG. 3C is a sectional view illustrating a variable resistance memory device according to example embodiments of inventive concepts, taken along line III-III' of FIG. 2A.

Referring to FIG. 3C, a variable resistance memory device according to the example embodiments may also include the first section La and the second section Lb thereon. However, in each of the sections La and Lb, each of the horizontal electrode layers 61-65 may have a thickness increasing with decreasing a vertical level thereof. In addition, the first section La may include a first the vertical electrode VEa and a first bit line contact BLCa, and the second section Lb may include a second the vertical electrode VEb and a second bit line contact BLCb, which may be shaped like the first the vertical electrode VEa and the first bit line contact BLCa.

Except for the above-described differences, the variable resistance memory device illustrated in FIG. 3B can be configured to have the same or similar technical features as the afore-described variable resistance memory devices according to example embodiments in FIGS. 3A, 3B and 4.

Figure 10:
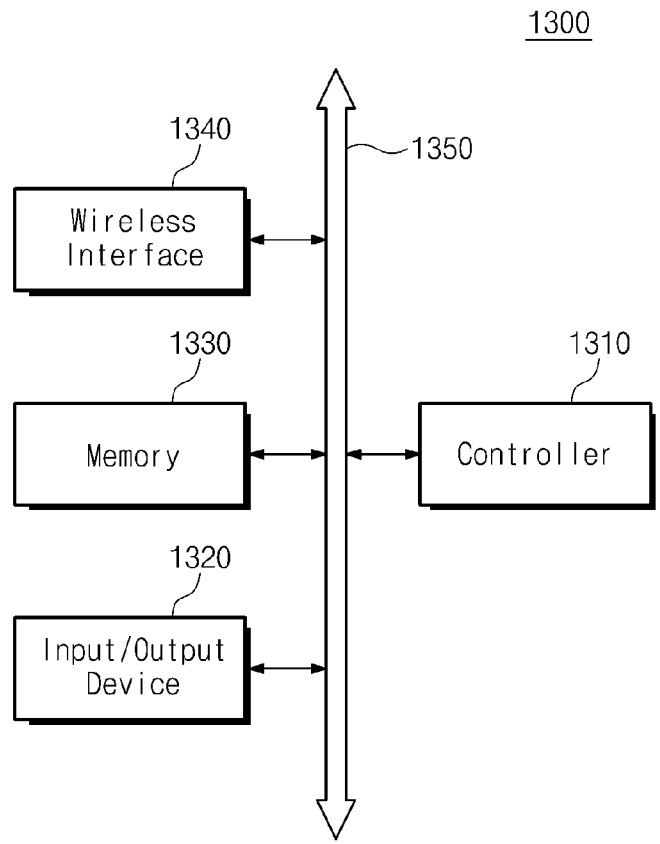
FIGS. 10 and 11 are block diagrams schematically illustrating electronic devices including a semiconductor device according to example embodiments of inventive concepts.
Figure 11:
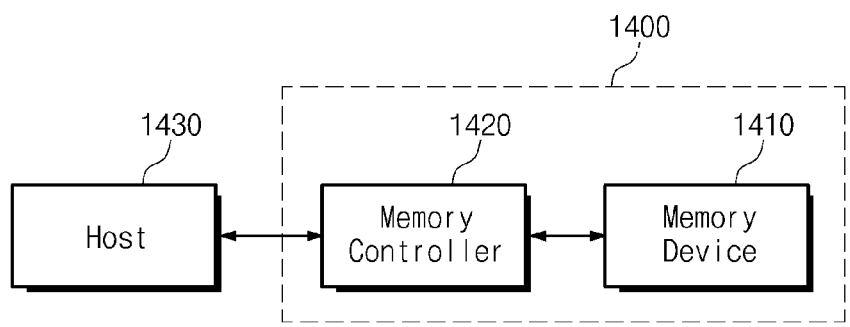

FIGS. 10 and 11 are block diagrams schematically illustrating electronic devices including a semiconductor device according to example embodiments of inventive concepts.

Referring to FIG. 10, an electronic device 1300 including a semiconductor device according to example embodiments of inventive concepts may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to example embodiments of inventive concepts. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 11, a memory system including a semiconductor device according to example embodiments of inventive concepts will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of inventive concepts.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which a semiconductor memory device according to example embodiments may be mounted may further include at least one semiconductor device (e.g., a controller and/or a logic device) that is configured to control the semiconductor memory device.

According to example embodiments of inventive concepts, a variable resistance memory device may include memory cells, in which contact areas between word lines and a variable resistance layer are almost constant. As a result, it is possible to reduce dispersion in electric characteristics of memory cells.

According to example embodiments of inventive concepts, a variable resistance memory device may be configured to include multi-layered word lines. This enables to realize a highly integrated variable resistance memory device.

While example embodiments of inventive concepts have been particularly shown and described, it will be understood by one of ordinary skill in the art that variations in form and detail may be made therein without departing from the spirit and scope of the attached claims.

What is claimed is:

1. A variable resistance memory device, comprising:
    a substrate;
    a vertical electrode on the substrate;
    horizontal electrode layers and insulating layers sequentially and alternately stacked on the substrate,
        the horizontal electrode layers and the insulating layers being adjacent to the vertical electrode, and a thickness of one of the horizontal electrode layers adjacent to the substrate being thicker than a thickness of an other of the horizontal electrode layers that is spaced apart from the substrate; and
    a variable resistance layer between the vertical electrode and the horizontal electrode layers, wherein
    the horizontal electrode layers and the insulating layers define a vertical electrode hole,
    a width of an upper portion of the vertical electrode hole is greater than a width of a lower portion of the vertical electrode hole, and
    the vertical electrode and the variable resistance layer are in the vertical electrode hole.

2. The device of claim 1, wherein a contact area between the one of the horizontal electrode layers adjacent to the substrate and the variable resistance layer is substantially equivalent to a contact area between the other of horizontal electrode layers that is spaced apart from the substrate and the variable resistance layer.

3. The device of claim 1, wherein
    the horizontal electrode layers include a first horizontal electrode layer and a second horizontal electrode layer,
    the first horizontal electrode layer and the second horizontal electrode layer are positioned at lowermost and uppermost levels of the horizontal electrode layers, respectively, and
    a thickness of the first horizontal electrode layer is greater than a thickness of the second horizontal electrode layer.

4. The device of claim 3, wherein
    the horizontal electrode layers further include a third horizontal electrode layer between the first horizontal electrode layer and the second horizontal electrode layer,
    a thickness of the third horizontal electrode layer is less than the thickness of the first horizontal electrode layer, and
    a thickness of the third horizontal layer is greater than the thickness of the second horizontal electrode layer.

5. The device of claim 3, further comprising:
    a selection line below the first horizontal electrode layer, wherein
    a thickness of the selection line is less than the thickness of the first horizontal electrode layer, and
    a thickness of the selection line is greater than the thickness of the second horizontal electrode layer.

6. The device of claim 1, wherein
    a number of the horizontal electrode layers is at least four,
    at least two lower ones of the horizontal electrode layers have substantially equal thicknesses,
    at least two upper ones of the horizontal electrode layers have substantially equal thicknesses, and
    the thicknesses of the at least two lower ones of the horizontal electrode layers are greater than the thicknesses of the at least upper ones of the horizontal electrode layers.

7. The device of claim 1, wherein
    the variable resistance memory device includes at least two sections stacked on the substrate,
    the variable resistance memory device includes at least two vertical electrodes stacked on the substrate,
    the variable resistance memory device includes at least two variable resistance layers stacked on the substrate, and
    each of the at least two sections includes one of the at least two vertical electrodes, at least one of the horizontal electrode layers, at least one of the insulating layers, and one of the at least two variable resistance layers.

8. The device of claim 1, wherein
the horizontal electrode layers include a plurality of odd-numbered word lines and a plurality of even-numbered word lines, which are alternately disposed parallel to each other,
the odd-numbered word lines are electrically connected to each other,
the even-numbered word lines are electrically connected to each other, and
the odd-numbered word lines are electrically isolated from the even-numbered word lines.

9. The device of claim 1, further comprising:
a selection gate electrode between the substrate and a lowermost one of the horizontal electrode layers;
a selection gate insulating layer between the selection gate electrode and the substrate; and
wherein the substrate includes first and second doped regions under both sides of the selection gate electrode.

10. The device of claim 9, wherein the vertical electrode is connected to the first doped region of the substrate.

11. The device of claim 9, further comprising:
a bit line crossing over an uppermost one of the horizontal electrode layers,
the bit line being electrically isolated from the horizontal electrode layers; and
a bit line contact that electrically connects the bit line to the second doped region.

12. A variable resistance memory device, comprising:
a substrate;
a vertical electrode on the substrate;
a variable resistance layer surrounding the vertical electrode; and
1 to N horizontal electrodes sequentially stacked on each other and spaced apart vertically along a sidewall of the variable resistance layer,
N being an integer greater than or equal to 2,
a thickness of the 1st horizontal electrode is greater than a thickness of the Nth horizontal electrode.

13. The variable resistance memory device of claim 12, further comprising:
a plurality of bit lines;
a plurality of bit line contacts connecting the plurality of bit lines to the substrate; and a plurality of odd word lines and a plurality of even word lines spaced apart vertically on the substrate; wherein
the vertical electrode is one of a plurality of vertical electrodes on the substrate,
the variable resistance layer is one of a plurality of variable resistance layers surrounding the plurality of vertical electrodes,
the 1 to N horizontal electrodes are part of 1 to N horizontal electrode layers spaced apart vertically on the substrate,
the 1 to N horizontal electrode layers define a plurality of first openings that are penetrated by the plurality of bit line contacts,
the 1 to N horizontal electrode layers define a plurality of second openings that are penetrated by the plurality of vertical electrodes,
each one of the plurality of odd word lines is connected to at least one horizontal electrode in one of the 1 to N horizontal electrode layers,
each one of the plurality of even word lines is connected to at least one horizontal electrode in one of the 1 to N horizontal electrode layers, and
the plurality of odd word lines are electrically isolated from the plurality of even word lines.

14. The variable resistance memory device of claim 12, further comprising:
a selection gate electrode between the 1st horizontal electrode and the substrate, wherein N is greater than or equal to 3,
the 2nd to Nth horizontal electrodes are thinner than the 1st horizontal electrode.

15. The variable resistance memory device of claim 12, further comprising:
a selection gate electrode between the 1st horizontal electrode and the substrate, wherein N is greater than or equal to 4,
a thickness of the (N-1)th horizontal electrode is substantially equal to the thickness of the Nth horizontal electrode, and
a thickness of the 2nd horizontal electrode is substantially equal to the thickness of the 1st horizontal electrode.

16. The variable resistance memory device of claim 12, further comprising:
a selection gate electrode between the 1st horizontal electrode and the substrate, wherein N is greater than or equal to 4, and
a thickness of the (N-1)th horizontal electrode is different than the thickness of the Nth horizontal electrode.

* * * * *